(12) United States Patent
Suzuki

(10) Patent No.: US 6,808,977 B2
(45) Date of Patent: Oct. 26, 2004

(54) METHOD OF MANUFACTURING SEMICONDUCTOR DEVICE

(75) Inventor: Masayuki Suzuki, Tokyo (JP)

(73) Assignees: Hitachi, Ltd., Tokyo (JP); NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 265 days.

(21) Appl. No.: 10/207,234

(22) Filed: Jul. 30, 2002

(65) Prior Publication Data

US 2003/0040181 A1 Feb. 27, 2003

(30) Foreign Application Priority Data

Jul. 31, 2001 (JP) ........................................ 2001-232511

(51) Int. Cl.[7] .......................................... H01L 21/8242
(52) U.S. Cl. .......................... 438/239; 438/386; 427/99
(58) Field of Search ........................... 427/99; 438/239, 438/386, 387, 686

(56) References Cited

U.S. PATENT DOCUMENTS

| | | | | |
|---|---|---|---|---|
| 5,820,664 A | * | 10/1998 | Gardiner et al. | 106/287.17 |
| 5,840,897 A | * | 11/1998 | Kirlin et al. | 546/2 |
| 6,110,529 A | * | 8/2000 | Gardiner et al. | 427/250 |
| 6,126,996 A | * | 10/2000 | Kirlin et al. | 427/252 |
| 2001/0029885 A1 | * | 10/2001 | Furuoya | 118/300 |

FOREIGN PATENT DOCUMENTS

JP          5-55464          3/1993

* cited by examiner

Primary Examiner—George Fourson
Assistant Examiner—Fernando L. Toledo
(74) Attorney, Agent, or Firm—Antonelli, Terry, Stout & Kraus, LLP

(57) ABSTRACT

Improving a film quality of a metal film formed by the CVD method, for example, an Ru film or the like constituting a lower electrode of a data storage capacitor. More specifically, the Ru film to be the lower electrode of the data storage capacitor is formed on a sidewall and a bottom surface of a hole in a silicon oxide film on which the data storage capacitor is formed, by the CVD method using $H_2O$ as a catalyst and $Ru(ACAC)(TMVS)_2$ [ACAC: acetylacetonate $(CH_3COCHCOCH_3)^-$, TMVS: trimetylvinylsilane $(CH_2CHSi(CH_3)_3)$] which is a one-valence Ru compound, as a material. As a result, by generating zero-valence Ru and $Ru(ACAC)_3$ containing three-valence Ru, the Ru film is formed. Therefore, if the Ru film is formed by the CVD method utilizing the disproportionate reaction, the film quality of the Ru film can be improved. Also, it is possible to prevent conductive films and the like located below the Ru film from oxidizing.

14 Claims, 28 Drawing Sheets

FIG. 13

$$3Ru(ACAC)(TMVS)_2 \xrightarrow{H_2O} 2Ru + Ru(ACAC)_3 + 6(TMVS)$$
$$(I) \qquad\qquad (0) \quad (III)$$

FIG. 18

$$\frac{3}{2}\text{Ru}(\text{ACAC})_2(\text{TMVS}) \xrightarrow{\text{H}_2\text{O}} \frac{1}{2}\text{Ru}(0) + \text{Ru}(\text{ACAC})_3 + \frac{3}{2}(\text{TMVS})$$
$$\text{(II)} \qquad\qquad\qquad\qquad \text{(III)}$$

FIG. 23

$$3\text{Ir}(\text{THD})(\text{COD}) \xrightarrow{\text{H}_2\text{O}} 2\text{Ir} + \text{Ir}(\text{THD})_3 + 3(\text{COD})$$
$$(\text{I}) \qquad\qquad (0) \quad (\text{III})$$

FIG. 28

| | Ru Ax By    OR    Ir Ax By |
|---|---|
| A | (diketonate structure diagram showing resonance) <br><br> R : CH3 <br> R : CF3 ( hexafluoroacetylacetonate ) <br> R : (CH3)3C |
| B | TMVS : $H_2C=CH$-$Si(CH_3)_3$ <br><br> TEVS : $H_2C=CH$-$Si(C_2H_5)_3$ <br><br> COD : (cyclooctadiene ring) |

METHOD OF MANUFACTURING SEMICONDUCTOR DEVICE

BACKGROUND OF THE INVENTION

The present invention relates to a method of manufacturing a semiconductor device, and, more specifically, to a technique effectively applied to an electrode constituting a capacitor.

For example, a DRAM (Dynamic Random Access Memory) has a memory cell selecting MISFET and a data storage capacitor connected to the MISFET in series. This data storage capacitor is formed by sequentially depositing, for example, silicon to be a lower electrode, tantalum oxide to be a capacitor dielectric film, and silicon to be an upper electrode.

For example, Japanese Patent Laid-open No. 5-55464 discloses a method of forming a tantalum tungsten film containing tantalum on a polycrystalline silicon film (lower electrode), selectively oxidizing this film in mixed gas of hydrogen and water vapor, and forming a charge storage dielectric film by a tantalum oxide film.

SUMMARY OF THE INVENTION

However, in the case where silicon is used as a material of the lower electrode, a silicon oxynitride layer is formed on an interface between silicon and tantalum oxide at the time of a heat treatment (in an oxygen atmosphere, at 700° C.) for the crystallization of tantalum oxide formed on the lower electrode and for the improvement of the film quality thereof. Thus, it has been difficult to make the lower electrode have a high dielectric constant.

The inventors of this invention have been engaged in the research and development of DRAM and examined various configurations and manufacturing methods of the above-mentioned data storage capacitor.

With the downsizing of the semiconductor integrated circuit device, an area used to form the data storage capacitor also tends to be reduced, and thereby it has become difficult to obtain a desired capacitance thereof. Therefore, the studies for electrode materials and capacitor dielectric materials have been demanded to obtain the data storage capacitor with a large capacitance and a small area.

Thus, the inventors have used an Ru film as a lower electrode of the data storage capacitor and made various studies for the manufacturing method thereof. This is because a platinum group metal like Ru forms no low-dielectric-constant film such as a silicon oxynitride film even by the heat treatment performed after the data storage capacitor is formed, and can be formed thinly owing to metal, and thereby is considered to be suitable to increase the capacitance thereof.

As a method of forming the Ru film, for example, a CVD method using a tetrahydrofuran solution of ethylcyclopentadienylruthenium ($Ru(C_2H_5C_5H_4)_2$) and $O_2$ (oxygen) as materials is available.

However, in the film forming method using the reaction between an organic compound (ethylcyclopentadienylruthenium) like this and oxygen, the organic compound itself and a compound of the organic compound and oxygen are left in the Ru film, thereby resulting in deterioration of the quality of the Ru film.

An object of the present invention is to provide a technique capable of improving a film quality of a metal film formed by the CVD method, for example, an Ru film and the like constituting a lower electrode of a data storage capacitor.

Another object of the present invention is to improve the characteristic of a semiconductor integrated circuit device by forming a good metal film therein.

The above and other objects and novel characteristics of the present invention will be apparent from the description of this specification and the accompanying drawings.

The advantages achieved by the typical ones of the inventions disclosed in this application will be briefly described as follows.

1. A method of manufacturing a semiconductor device according to the present invention is one in which a platinum group metal is formed on a semiconductor substrate by a reaction using a one-valence or two-valence platinum group compound as a material and $H_2O$ as a catalyst.

2. A method of manufacturing a semiconductor device according to the present invention comprises the steps of: forming a first conductor on a semiconductor substrate; forming a second conductor on said first conductor; and forming a third conductor on said second conductor, wherein the third conductor made of a platinum group metal is formed by a reaction using a one-valence or two-valence platinum group compound as a material and $H_2O$ as a catalyst.

3. A method of manufacturing a semiconductor device according to the present invention is one in which a platinum group metal is formed on a semiconductor substrate by a disproportionate reaction using a platinum group compound as a material and $H_2O$ as a catalyst.

BRIEF DESCRIPTIONS OF THE DRAWINGS

FIG. 13 shows a reaction formula for forming an Ru film in a method of manufacturing a semiconductor integrated circuit device according to the first embodiment of the present invention.

FIG. 18 shows a reaction formula for forming another Ru film in a method of manufacturing a semiconductor integrated circuit device according to a first embodiment of the present invention.

FIG. 23 shows a reaction formula for forming an Ir film in a method of manufacturing a semiconductor integrated circuit device according to a second embodiment of the present invention.

FIG. 28 is a diagram for explaining an Ru compound and an Ir compound used in the embodiments of the present invention.

DESCRIPTIONS OF THE PREFERRED EMBODIMENTS

Hereinafter, embodiments of the present invention will be described in detail based on the drawings. Note that members having the same function are denoted by the same reference symbols throughout all the drawings for describing the embodiments, and the repetitive descriptions thereof will be omitted.

(First Embodiment)

A method of manufacturing a DRAM according to this embodiment will be described in order of the manufacturing process thereof with using FIGS. 1 to 17.

Figure 1:
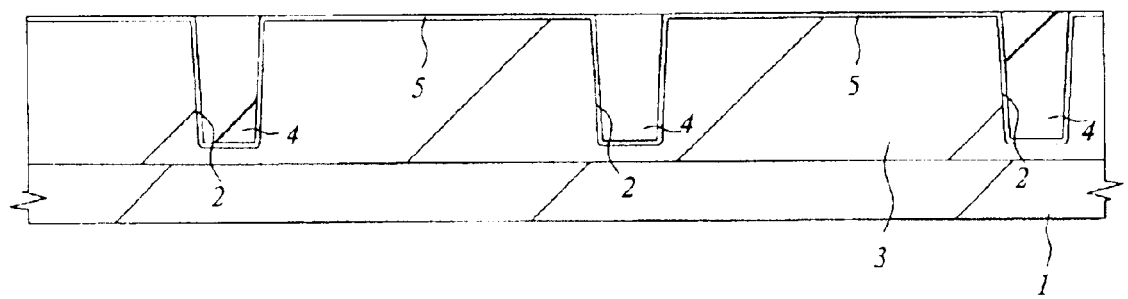
FIG. 1 is a cross-sectional view showing the principal part of a semiconductor substrate used in a method of manufacturing a semiconductor integrated circuit device according to a first embodiment of the present invention.
Figure 2:
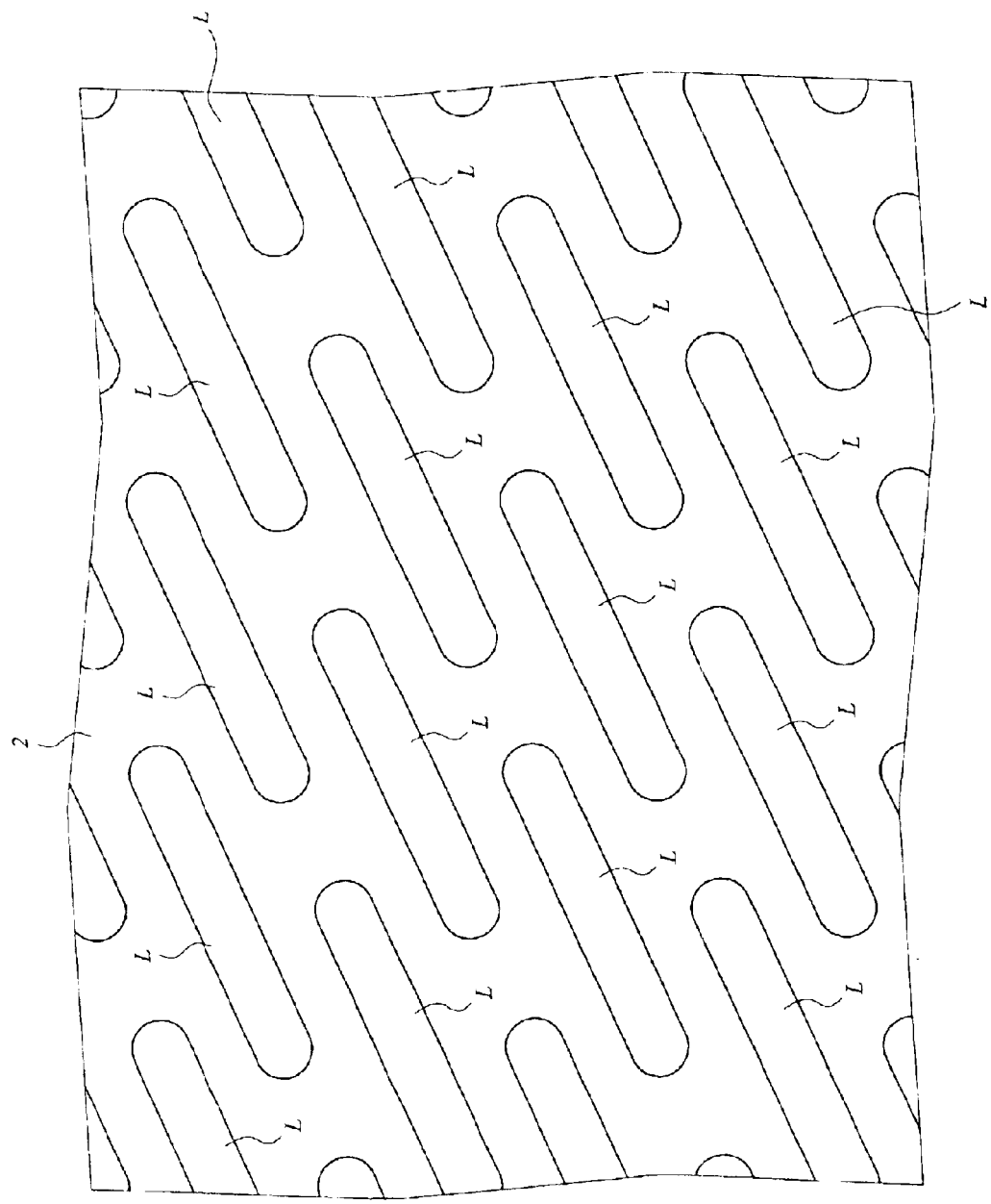
FIG. 2 is a plan view showing the principal part of a semiconductor substrate used in a method of manufacturing a semiconductor integrated circuit device according to a first embodiment of the present invention.

First, as shown in FIG. 1, an element isolation 2 is formed in an element isolation region on a main surface of a semiconductor substrate 1 made of, for example, p type single crystal silicon. Also, at the same time of the formation of the element isolation 2, oval island-shaped active regions (L) surrounded by the element isolation 2 are formed as shown in FIG. 2. Two memory cell selecting MISFETs Qs each having a common source or drain are formed in each of the active regions (L).

The element isolation 2 is formed in a manner as follows. That is, a trench with a depth of about 300 nm to 400 nm is formed by etching the surface of the semiconductor substrate 1, and a thin silicon oxide film is formed inside the trench. Subsequently, a silicon oxide film 4 (with a thickness of about 600 nm) is deposited on the semiconductor substrate 1 and in the trench by the CVD (Chemical vapor Deposition) method. Thereafter, the silicon oxide film 4 is polished back by a CMP (Chemical Mechanical Polishing) method.

Next, a p well 3 is formed by implanting B (boron) ions into the semiconductor substrate 1, and subsequently the surface of the p well 3 is washed with using an HF (hydrofluoric acid) cleaning solution. Thereafter, thermal oxidation is performed to the semiconductor substrate 1, and thereby a gate dielectric film 5 having a thickness of about 6 nm is formed on the surface of the p well 3 (each active region L).

Figure 3:
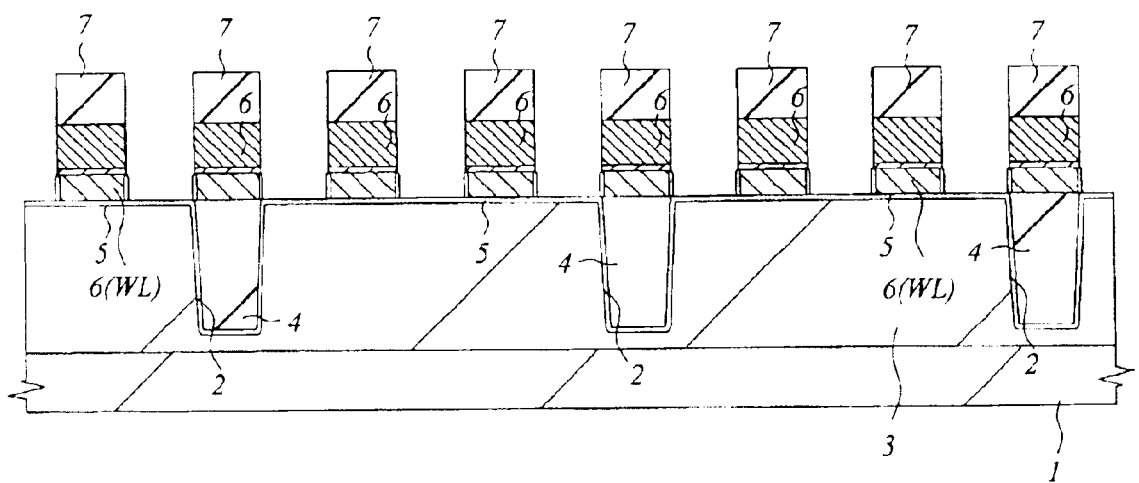
FIG. 3 is a cross-sectional view showing the principal part of a semiconductor substrate used in a method of manufacturing a semiconductor integrated circuit device according to a first embodiment of the present invention.

Next, gate electrodes 6 are formed on the upper portion of the gate dielectric film 5 as shown in FIG. 3. Each gate electrode 6 is formed in a manner as follows. That is, an n type polycrystalline silicon film (with a thickness of about 70 nm) doped with P (phosphorus) or the like, a barrier metal film (with a thickness of about 5 nm to 10 nm) made of WN (tungsten nitride) or TiN (titanium nitride), a W (tungsten) film (with a thickness of about 100 nm), and a silicon nitride film 7 (with a thickness of about 150 nm) are sequentially deposited on the gate dielectric film 5. Thereafter, these films are dry-etched with using a photoresist film (not shown) as a mask. In this case, the polycrystalline silicon film and the silicon nitride film 7 are deposited by the CVD method and the barrier metal film and the W film are deposited by the sputtering method. Each gate electrode 6 functions as a word line (WL). Subsequently, a wet hydrogen oxidation is performed to form a thin silicon oxide film on the sidewall of an n type polycrystalline silicon film constituting each gate electrode 6. This wet hydrogen oxidation enables to selectively form an oxide film only on silicon.

Figure 4:
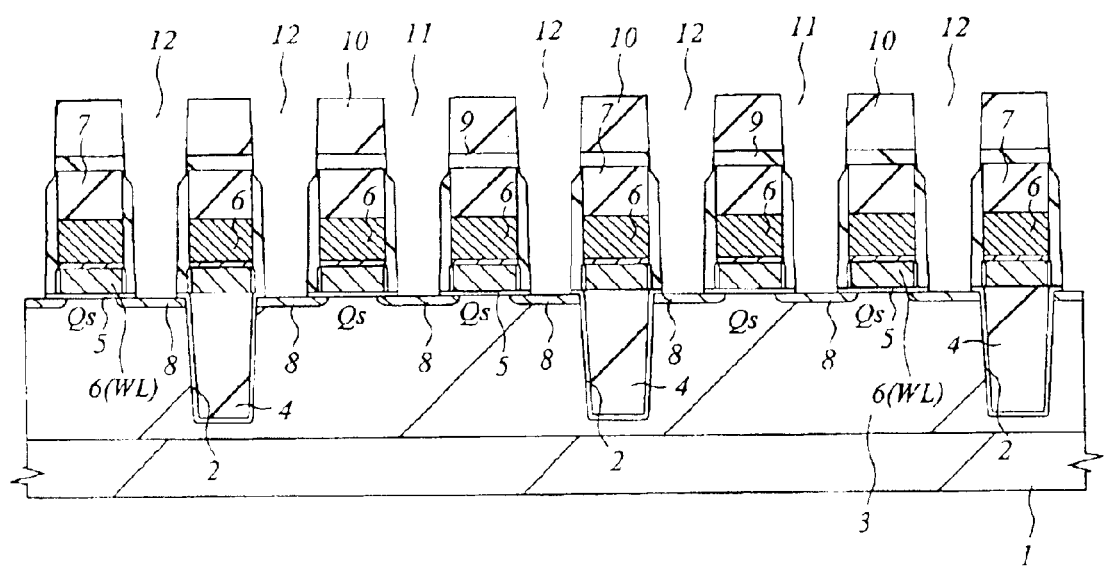
FIG. 4 is a cross-sectional view showing the principal part of a semiconductor substrate used in a method of manufacturing a semiconductor integrated circuit device according to a first embodiment of the present invention.

Next, as shown in FIG. 4, As (arsenic) or P (phosphorus) ions are implanted into the p well 3 to form n type semiconductor regions 8 (source and drain) in the p well 3 located in both sides of each gate electrode 6. By the steps as mentioned above, the memory cell selecting MISFET Qs is almost completed.

Next, a silicon nitride film 9 (with a thickness of 50 nm) and a silicon oxide film 10 (with a thickness of about 600 nm) are deposited over the semiconductor substrate 1 by the CVD method. Subsequently, the surface of the silicon oxide film 10 is flattened by the CMP method. Thereafter, the silicon oxide film 10 and the silicon nitride film 9 are dry-etched with using a photoresist film (not shown) as a mask, and thereby contact holes 11 and 12 are formed on the n type semiconductor regions 8 (source and drain) of the memory cell selecting MISFETs Qs. The etching of the silicon oxide film 10 is performed under the condition that an etching selectivity to the silicon nitride film is high and the etching of the silicon nitride film 9 is performed under the condition that an etching selectivity to the silicon and the silicon oxide film is high. Thus, the contact holes 11 and 12 are formed self-alignedly with the gate electrodes 6 (word line).

Figure 5:
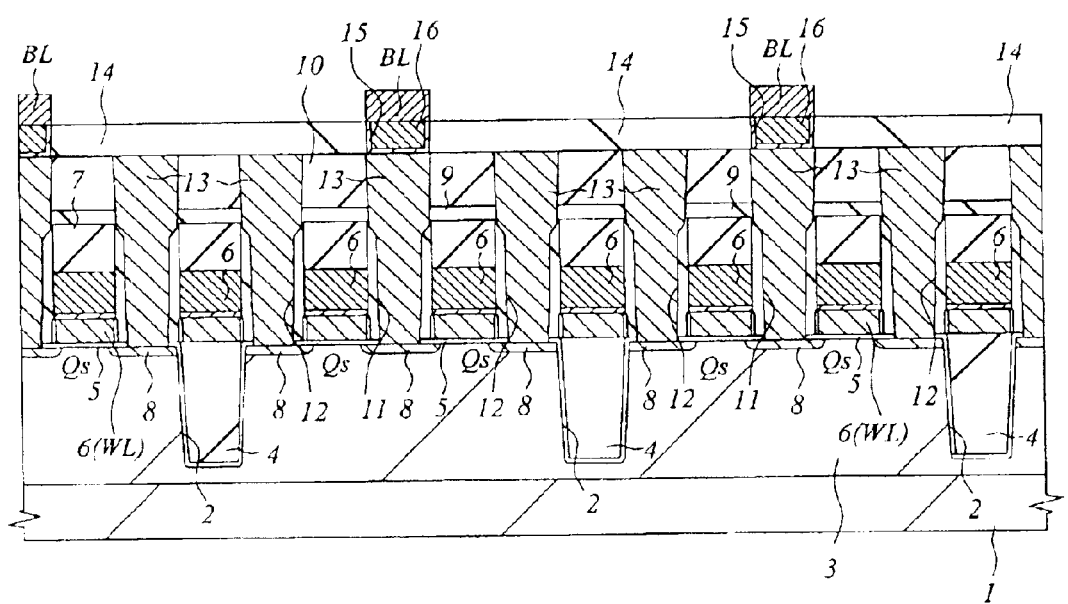
FIG. 5 is a cross-sectional view showing the principal part of a semiconductor substrate used in a method of manufacturing a semiconductor integrated circuit device according to a first embodiment of the present invention.

Next, plugs 13 are formed in the contact holes 11 and 12 as shown in FIG. 5. The plugs 13 are formed in a manner as follows. That is, by depositing an n type polycrystalline silicon film doped with P (phosphorus) on the silicon oxide film 10 by the CVD method, this n type polycrystalline silicon film is buried in the contact holes 11 and 12. Thereafter, the n type polycrystalline silicon film outside the contact holes 11 and 12 is removed by the CMP method (or the etching back). Then, the impurities (phosphorus) in the plugs 13 are diffused into the n type semiconductor regions 8 (source and drain) by a heat treatment, and thereby each contact resistance between the n type semiconductor regions 8 (source and drain) and the plugs 13 can be reduced.

Next, a silicon oxide film 14 (with a thickness of about 150 nm) is deposited on the silicon oxide film 10 by the CVD method. Thereafter, the silicon oxide film 14 located on each contact hole 11 is dry-etched with using a photoresist film (not shown) as a mask, and thereby each through hole 15 is formed.

Next, a plug 16 is formed in each through hole 15. The plug 16 is formed in a manner as follows. That is, a barrier metal film made of a laminated film of a Ti film and a TiN film is deposited on the silicon oxide film 14 by, for example, the sputtering method. Subsequently, a W film is deposited on the barrier metal film by the CVD method, and thereby these films are buried in each through hole 15. Thereafter, these films located outside each through hole 15 are removed by the CMP method. The n type semiconductor regions 8 (source and drain) of the memory cell selecting MISFETs Qs and the later-described bit lines BL are connected via the plugs 13 and 16.

Next, each bit line BL is formed on the silicon oxide film 14 and each plug 16. The bit lines BL are formed in a manner as follows. That is, a TiN film (with a thickness of about 10 nm and not shown) is deposited on the silicon oxide film 14 by the sputtering method. Subsequently, a W film (with a thickness of about 50 nm) is deposited on the TiN film by the CVD method. Thereafter, these films are dry-etched with using a photoresist film (not shown) as a mask.

Figure 6:
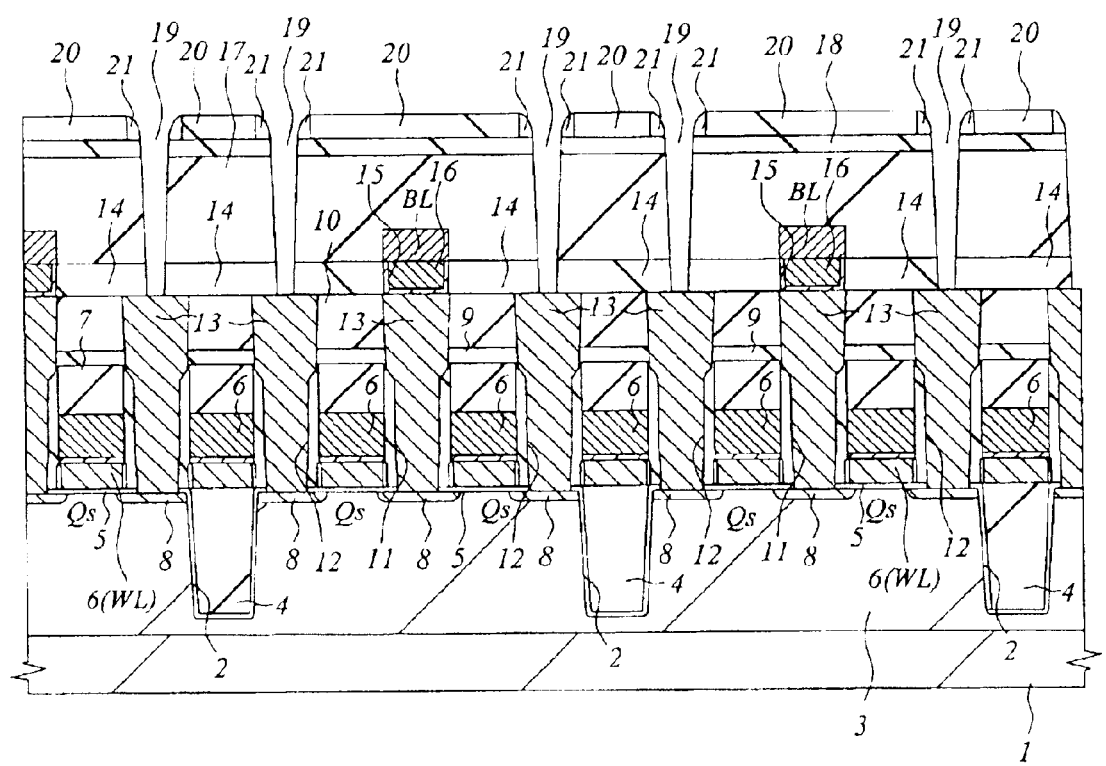
FIG. 6 is a cross-sectional view showing the principal part of a semiconductor substrate used in a method of manufacturing a semiconductor integrated circuit device according to a first embodiment of the present invention.

Next, as shown in FIG. 6, a silicon oxide film 17 (with a thickness of about 300 nm) is deposited on each bit line BL by the CVD method and subsequently the surface thereof is flattened by the CMP method. Next, a silicon nitride film 18 (with a thickness of about 50 nm) is deposited on the silicon oxide film 17 by the CVD method.

Next, the silicon nitride film 18 and the silicon oxide film 17 and the like are dry-etched, and thereby a through hole 19 is formed at each upper portion of the contact holes 12 in which the plugs 13 are buried.

Each through hole 19 is formed so as to have a diameter smaller than the diameter of each contact hole 12 formed below it. In this case, the diameter of each though hole 19 is about 0.1 μm. More specifically, the through holes 19 are formed in a manner as follows. That is, a polycrystalline silicon film 20 is deposited on the silicon nitride film 18 by the CVD method, and subsequently the polycrystalline silicon film 20 in the region used to form each through hole 19 is dry-etched to form holes (with a diameter of about 0.18 μm). Thereafter, a polycrystalline silicon film (not shown) is further deposited on the polycrystalline silicon film 20. Then, the polycrystalline silicon film located on the polycrystalline silicon film 20 is anisotropically etched to form a sidewall spacer 21 on the sidewall of each hole. Subsequently, the silicon nitride film 18 and the silicon oxide films 17 and 14 located at the bottoms of the holes are dry-etched with using the polycrystalline silicon film 20 and the sidewall spacers 21 as hard masks.

Figure 7:
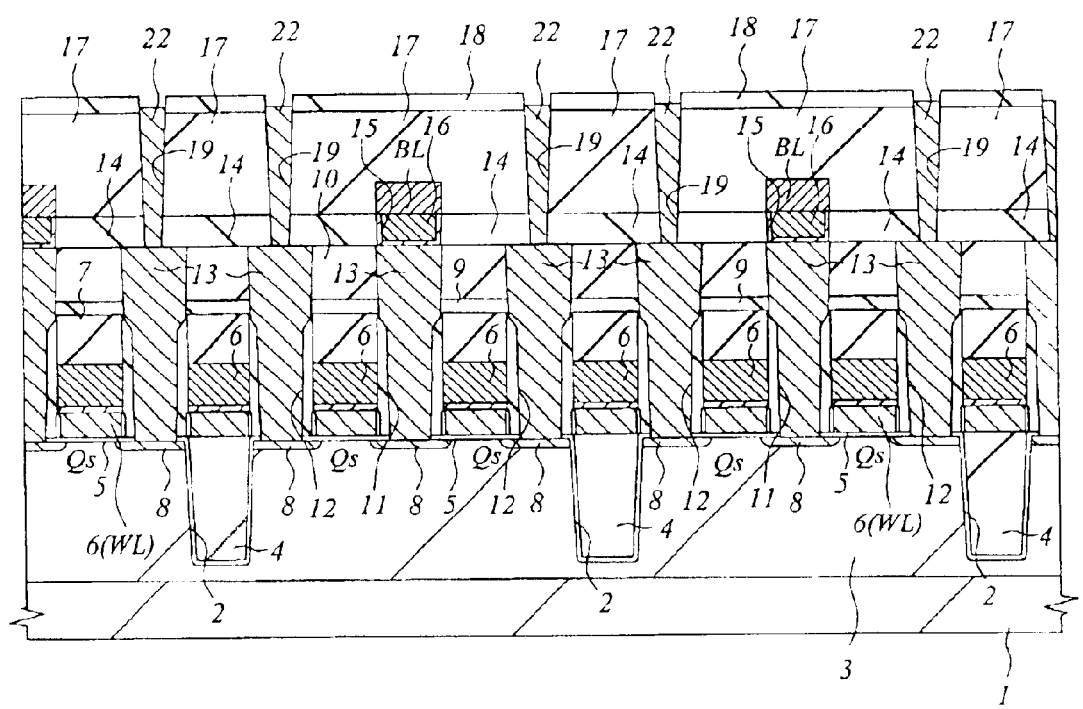
FIG. 7 is a cross-sectional view showing the principal part of a semiconductor substrate used in a method of manufacturing a semiconductor integrated circuit device according to a first embodiment of the present invention.

Next, after the polycrystalline silicon film 20 and each sidewall spacer 21 are removed by the dry etching, a plug 22 is formed in each through hole 19 as shown in FIG. 7. Each plug 22 is formed in a manner as follows. That is, an n type polycrystalline silicon film doped with P is deposited on the silicon nitride film 18 by the CVD method, thereby being buried in each through hole 19. Thereafter, the n type polycrystalline silicon film located outside each through hole 19 is removed by the CMP method (or the etching back). At this time, the polycrystalline silicon film is over-polished (or over-etched), and thereby the height of the surface of each plug 22 is made lower than the uppermost portion of each through hole 19. Note that the plugs 22 may be formed by the use of a W film.

Figure 8:
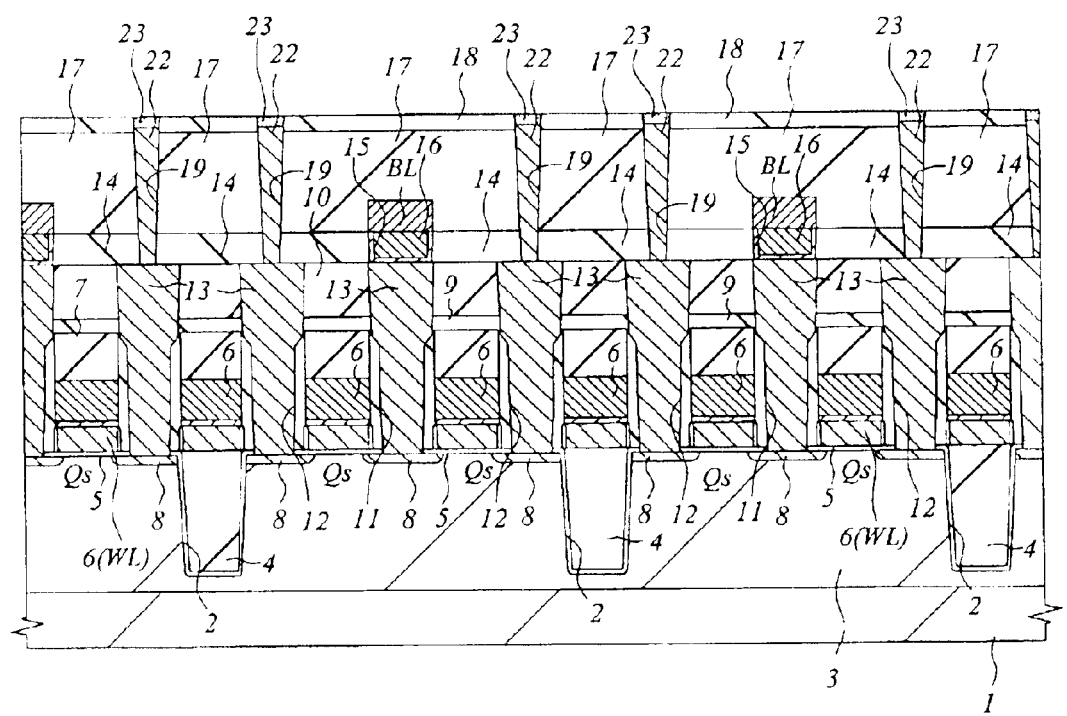
FIG. 8 is a cross-sectional view showing the principal part of a semiconductor substrate used in a method of manufacturing a semiconductor integrated circuit device according to a first embodiment of the present invention.

Next, as shown in FIG. 8, a barrier layer 23 is formed on each plug 22. The barrier layer 23 is formed in a manner as follows. That is, after a WN film is deposited on the silicon nitride film 18 by the sputtering method, the WN film located outside each through hole 19 is removed by the CMP method (or the dry etching). The barrier layer 23 is formed to prevent an undesirable silicide reaction of Ru (ruthenium) constituting each lower electrode 30A and polycrystalline silicon constituting each plug 22, which is caused by the heat treatment performed in the later-described manufacturing process. Note that this barrier layer 23 may be formed of a W film, a TiN film, a Ta (tantalum) film, or a TaN (tantalum nitride) film.

Thereafter, a data storage capacitor C constituted by each lower electrode 30A made of an Ru film 30, a capacitor dielectric film made of a tantalum oxide film 32, and each upper electrode 33 made of a W film/Ru film is formed on the barrier layer 23.

The process for forming the data storage capacitor C will be described in detail with reference to FIGS. 9 to 17. These figures schematically show a region for forming the data storage capacitor C over one plug 22.

Figure 9:
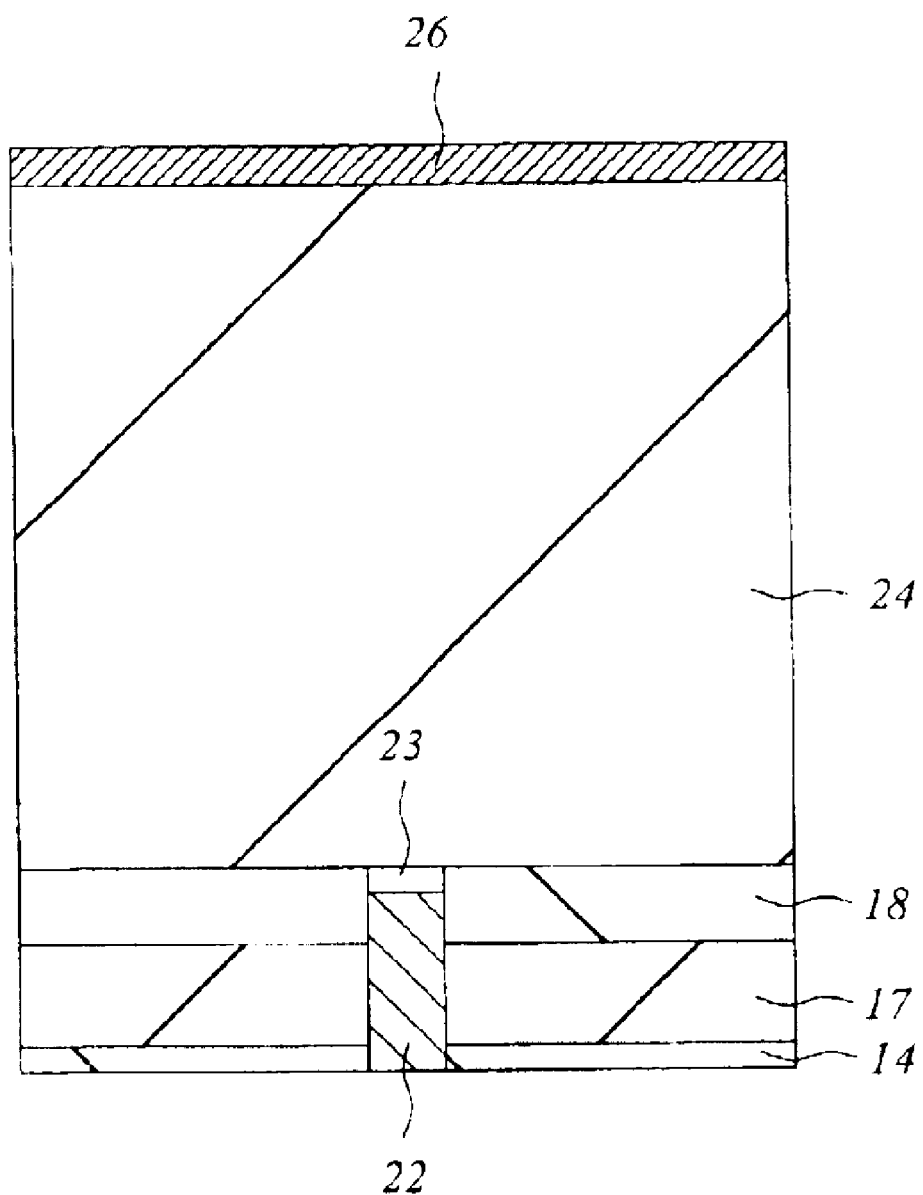
FIG. 9 is a cross-sectional view showing the principal part of a semiconductor substrate used in a method of manufacturing a semiconductor integrated circuit device according to a first embodiment of the present invention.

As shown in FIG. 9, a silicon oxide film 24 is formed on the barrier layer 23 and the silicon nitride film 18. One lower electrode of the data storage capacitor C is formed in a hole (concave portion) formed in the silicon oxide film 24. It is required to form the silicon oxide film 24 thickly (about 0.8 μm) to increase the surface area of the lower electrode and an amount of charge stored therein. The silicon oxide film 24 is deposited by, for example, the plasma CVD method using oxygen and tetraethoxysilane (TEOS) as source gases. Thereafter, the surface thereof is flattened by the CMP method if necessary.

Next, a W film having a thickness of about 200 nm is deposited on the silicon oxide film 24 by the sputtering method. Subsequently, an anti-reflection film is coated on the W film, and thereby a hard mask 26 is formed. Since an etching selectivity to the silicon oxide film 24 is higher than to a photoresist film, this hard mask 26 (W film) is used as a mask in etching the thick silicon oxide film 24.

Figure 10:
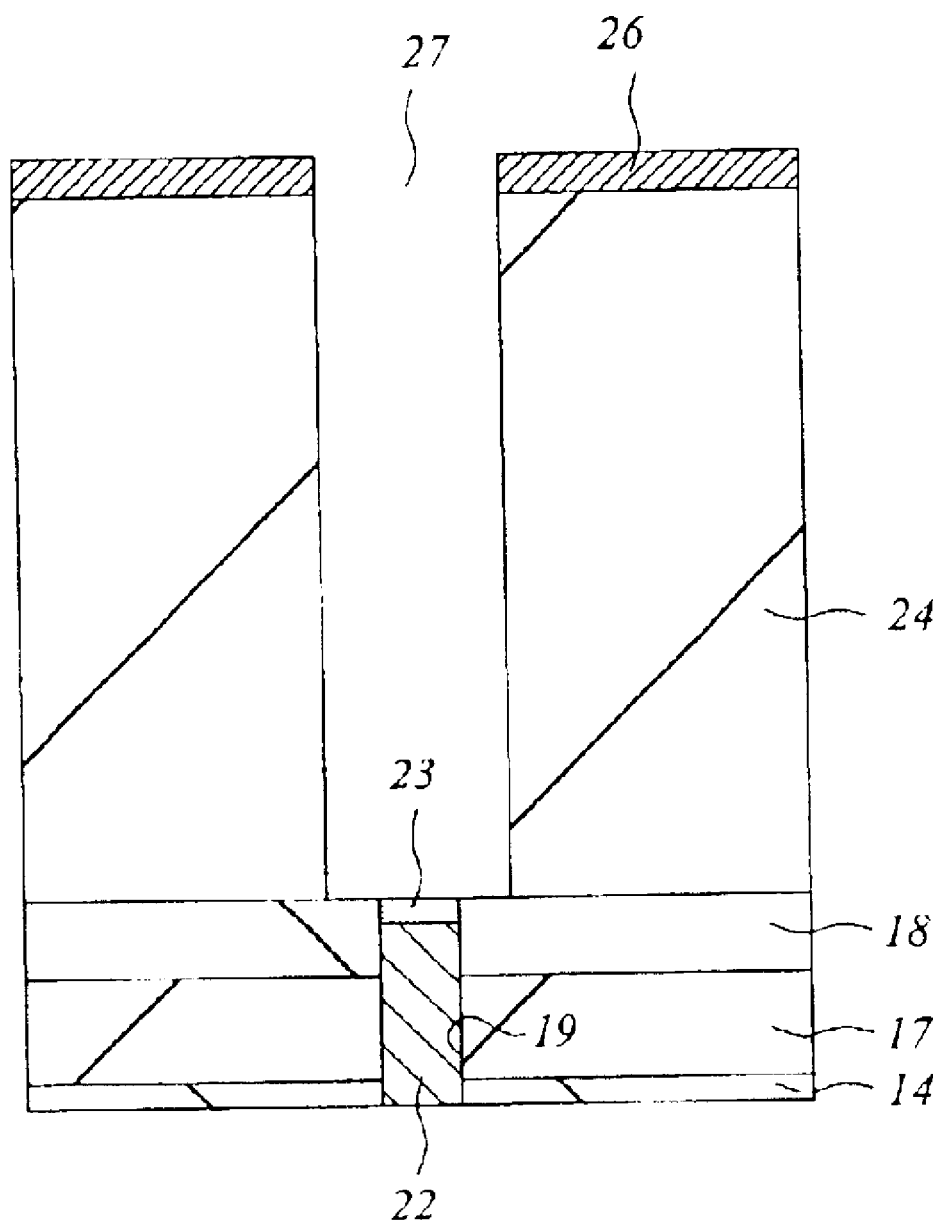
FIG. 10 is a cross-sectional view showing the principal part of a semiconductor substrate used in a method of manufacturing a semiconductor integrated circuit device according to a first embodiment of the present invention.

Next, as shown in FIG. 10, a photoresist film (not shown) is formed on the hard mask 26 and the hard mask 26 is dry-etched with using the photoresist film as a mask. Subsequently, the silicon oxide film 24 is dry-etched with using the hard mask 26 as a mask, and thereby a deep hole (concave portion) 27 is formed. The surface of the barrier layer 23 located in one through hole 19 is exposed to the bottom surface of the deep hole (concave portion) 27.

Figure 11:
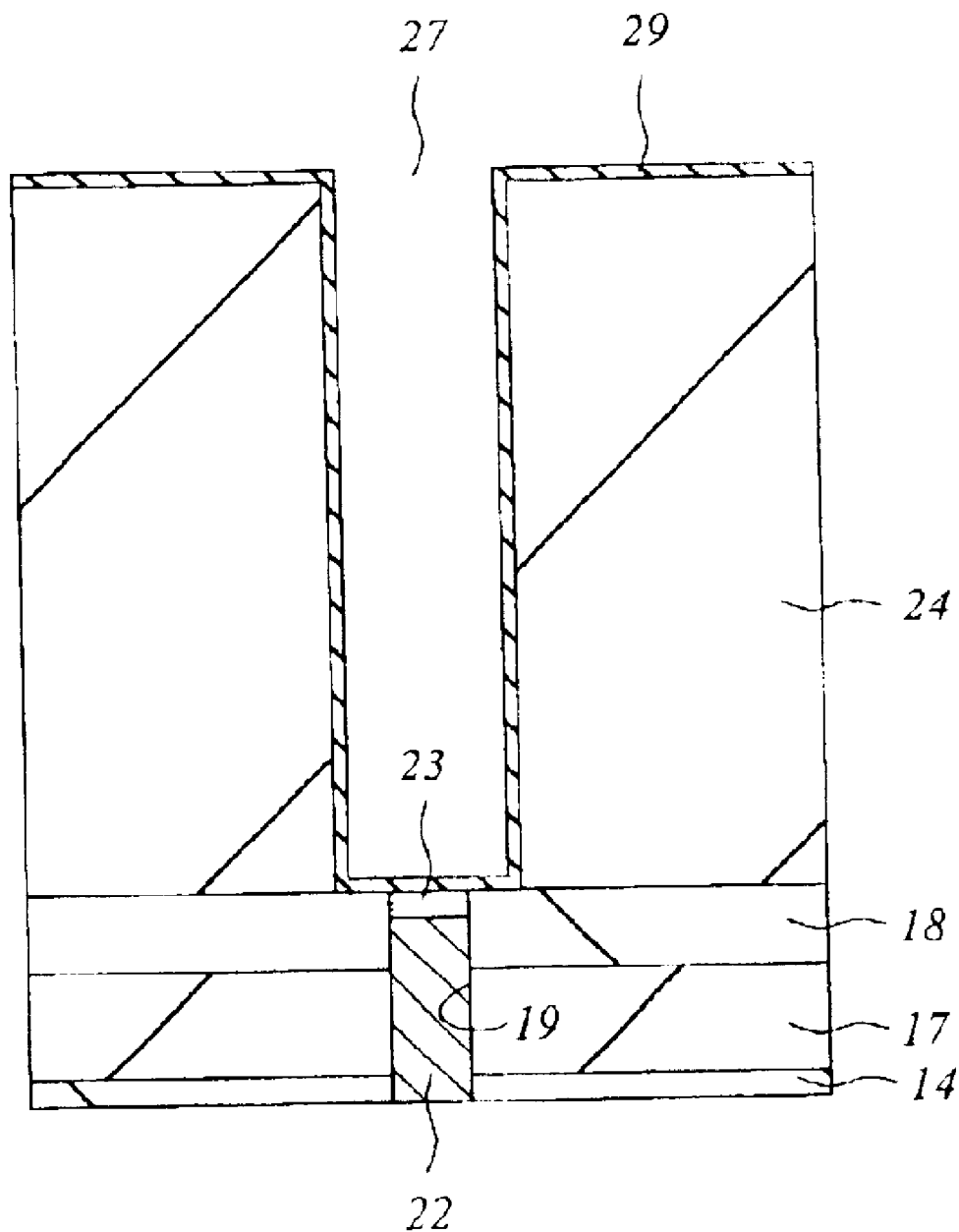
FIG. 11 is a cross-sectional view showing the principal part of a semiconductor substrate used in a method of manufacturing a semiconductor integrated circuit device according to a first embodiment of the present invention.

Next, after the hard mask 26 remaining on the silicon oxide film 24 is removed by the use of a solution containing hydrogen peroxide water, a WN film 29 (with a thickness of about 15 nm) is deposited on the silicon oxide film 24 and in the hole 27 by the sputtering method as shown in FIG. 11. This WN film 29 is used as an adhesion layer because having a good adhesiveness to the silicon oxide film 24 that is ground and to a Ru film 30 described later. Note that if the adhesiveness between the silicon oxide film 24 and the Ru film 30 can be obtained sufficiently by improving the film-forming method and/or condition of the later-described Ru film 30, the step of forming the adhesion layer can be omitted.

Figure 12:
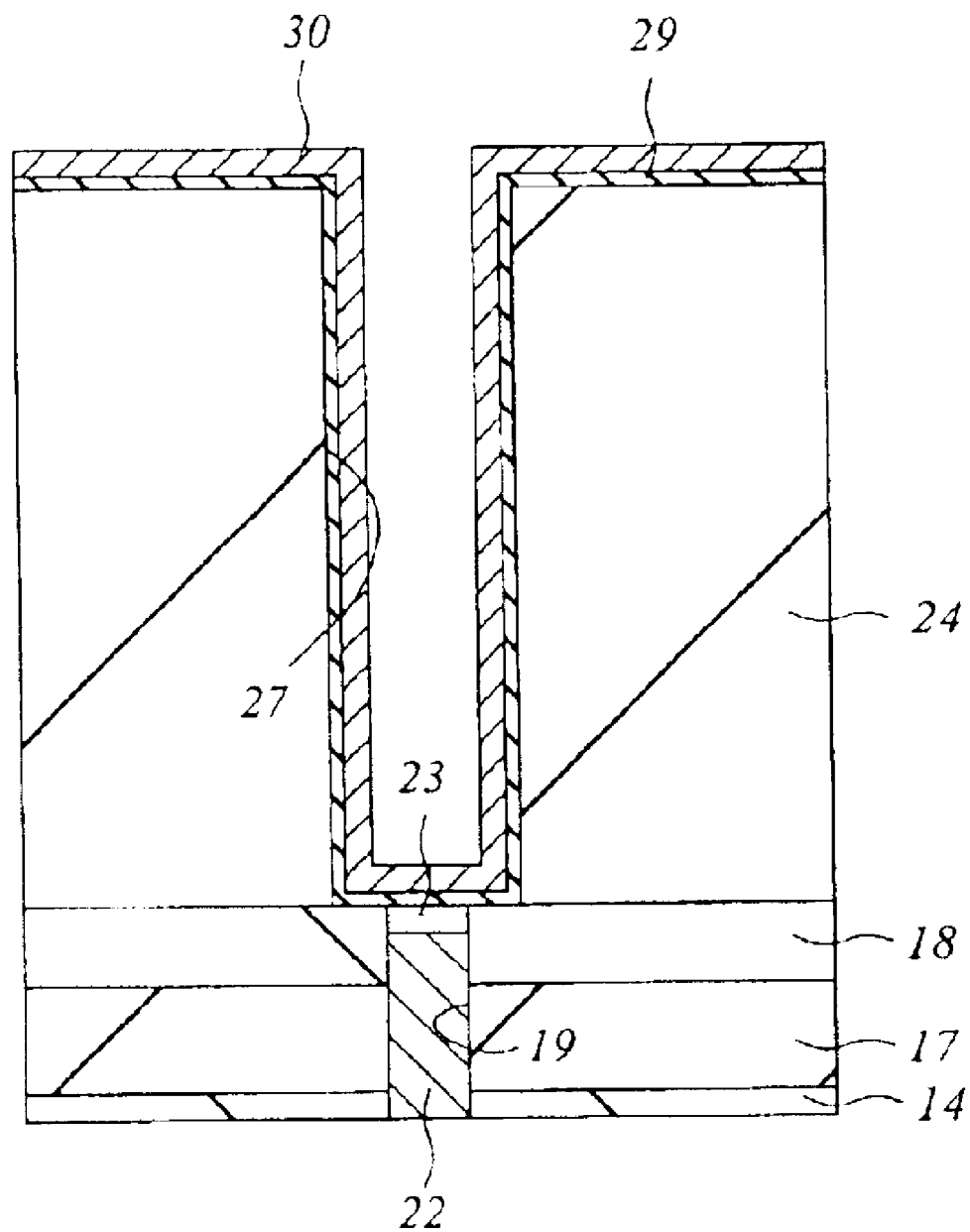
FIG. 12 is a cross-sectional view showing the principal part of a semiconductor substrate used in a method of manufacturing a semiconductor integrated circuit device according to a first embodiment of the present invention.

Next, as shown in FIG. 12, the Ru film 30 (with a thickness of about 30 nm) is deposited on the WN film 29 by the CVD method. Before the deposition of the Ru film by the CVD method, however, an Ru film (not shown) having a thickness of about 15 nm is formed by the sputtering method. This is because the film formed by the sputtering method becomes a seed and the Ru film 30 formed by the CVD method is made to grow effectively.

Figure 27:
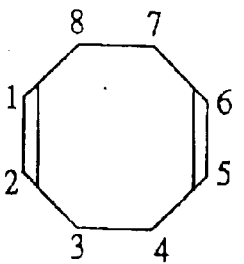
FIG. 27 is a diagram for explaining an Ru compound and an Ir compound used in the embodiments of the present invention.

This Ru film 30 can be formed by the CVD method using, for example, a tetrahydrofuran solution containing $Ru(ACAC)(TMVS)_2$, which is an organic compound of Ru, as a material and $H_2O$ as a catalyst. In this case, ACAC means acetylacetonate $(CH_3COCHCOCH_3)^-$ and TMVS means tri-methyl-vinylsilane $(CH_2CHSi(CH_3)_3)$. Note that structural formulas of ACAC and TMVS are shown in FIG. 27.

The tetrahydrofuran solution containing the Ru compound is vaporized and is disproportionated, and thereby the Ru film is formed. As shown in FIG. 13, the main reaction in forming the Ru film is such a reaction that $Ru(ACAC)(TMVS)_2$ becomes Ru, $Ru(ACAC)_3$, and TMVS. In the reaction, Ru of $Ru(ACAC)(TMVS)_2$ has a valence of one, Ru to be generated has a valence of zero, and Ru of $Ru(ACAC)_3$ has a valence of three. More specifically, zero-valence Ru and a three-valence Ru compound is generated from a one-valence Ru compound. Such a reaction that one kind of substance consists of two or more molecules and is oxidized, reduced and/or the like, consequently creating two or more kinds of substances is called a disproportionate reaction.

Also, $H_2O$ is not consumed in this reaction and has a catalytic function, and so the reaction rate thereof is increased by adding $H_2O$ to the reaction system. This $H_2O$ is thought to be adsorbed onto the material and to promote the reaction. Note that since a reaction chamber in which the reaction is performed is discharged, it is necessary to appropriately supply $H_2O$ similarly to $Ru(ACAC)(TMVS)_2$ that is the essential material. In addition, once the reaction has been performed, Ru (solid state) is exhausted from the reaction system. Therefore, the reaction proceeds to right in terms of the reaction formula shown in FIG. 13.

In this embodiment as described above, since the disproportionate reaction using $Ru(ACAC)(TMVS)_2$ [Ru: one valence] as a material is used to form the Ru film, the Ru film having a good film quality can be obtained. Also, since $H_2O$ is added thereto as a catalyst, it is possible to increase the reaction rate.

It is also possible that the Ru organic compound solution such as a tetrahydrofuran solution or the like containing ruthenocene $(Ru(C_2H_5)_2)$ is vaporized and reacted with $O_2$ and thereby the Ru film is formed. However, this case is such a reaction as to generate Ru by making incomplete combustion caused not to oxidize Ru. Consequently, in addition to carbon, hydrogen and an oxygen compound(s) thereof, an organic compound and oxide thereof generated by the reaction are taken in the Ru film, which causes the quality of the Ru film to degenerate. Furthermore, by a heat treatment to be performed thereafter, for example, a heat treatment for densifying the Ru film, or the like, carbon, hydrogen, an oxygen compound(s) thereof and the like taken in the Ru film are vaporized, which causes the quality of the Ru film to degenerate. Still further, oxygen and an oxygen compound(s) in the Ru film oxidize both of the WN film 29 functioning as an adhesion layer and the barrier layer 23, which causes conduction failure between the plug 22 and the lower electrode (Ru film 30). Particularly, as described above, the conduction failure frequently occurs in the case where the plug 22 has a small diameter.

In contrast, according to this embodiment, the disproportionate reaction using $Ru(ACAC)(TMVS)_2$ [Ru: one valence] as a material and $H_2O$ as a catalyst is utilized to form the Ru film. Therefore, it is possible to reduce by-products to be taken in the Ru film, for example, carbon, hydrogen, and a compound(s) thereof. More specifically, since the Ru film having a good crystalline property can be formed, even if carbon, hydrogen and an oxygen compound (s) thereof taken in the Ru film are vaporized by a heat treatment thereafter performed, for example, a heat treatment for densifying the Ru film, or the like, then the film quality of the Ru film can be kept with the vaporized amount thereof small. Also, even at the time of the heat treatment of the capacitor dielectric film formed on the lower electrode (Ru film 30) described later, it is possible to reduce film shrinkage due to the vaporization of carbon or the like in the Ru film and so prevent the breakage of the capacitor dielectric film. Consequently, the characteristics of the data storage capacitor C can be improved. Additionally, the amounts of oxygen and oxygen compound(s) containing in the Ru film can be reduced and the conduction failure between the plug 22 and the lower electrode (Ru film 30) can be prevented.

It is also possible to perform a reducing reaction of $H_2$ by adding $H_2$ to both systems of $Ru(ACAC)(TMVS)_2$ [Ru: one valence] and H$_2$O. In this case, however, since the use of three kinds of gases (RU(ACAC)(TMVS)$_2$, H$_2$O and H$_2$) is required, the layout of gas pipes for connecting to the CVD equipment becomes complicated. Further, since H$_2$ has a wide range of explosion limit, cautious handling of H$_2$ is required.

In contrast, according to this embodiment, the disproportionate reaction using Ru(ACAC)(TMVS)$_2$ [Ru: one valence] as a material and H$_2$O as a catalyst is utilized to form the Ru film. Therefore, it is possible to suppress the kinds of gases required in the reaction. Also, since no H$_2$ is used, it is possible to increase the safety of the reaction. Note that if a concentration of H$_2$ is 4% or lower, it is without the range of the explosion limit. Therefore, if H$_2$ having such concentration is used, the safety can be enhanced similarly.

Additionally, since this disproportionate reaction proceeds even at a temperature equal to or lower than 250° C., the metal films below said Ru film (e.g., WN film (adhesion layer), barrier layer (WN film), and plug (silicon film)) can be prevented from oxidizing.

Next, the heat treatment at 700° C. for one minute is performed in an nitride atmosphere to densify the Ru film 30.

Figure 14:
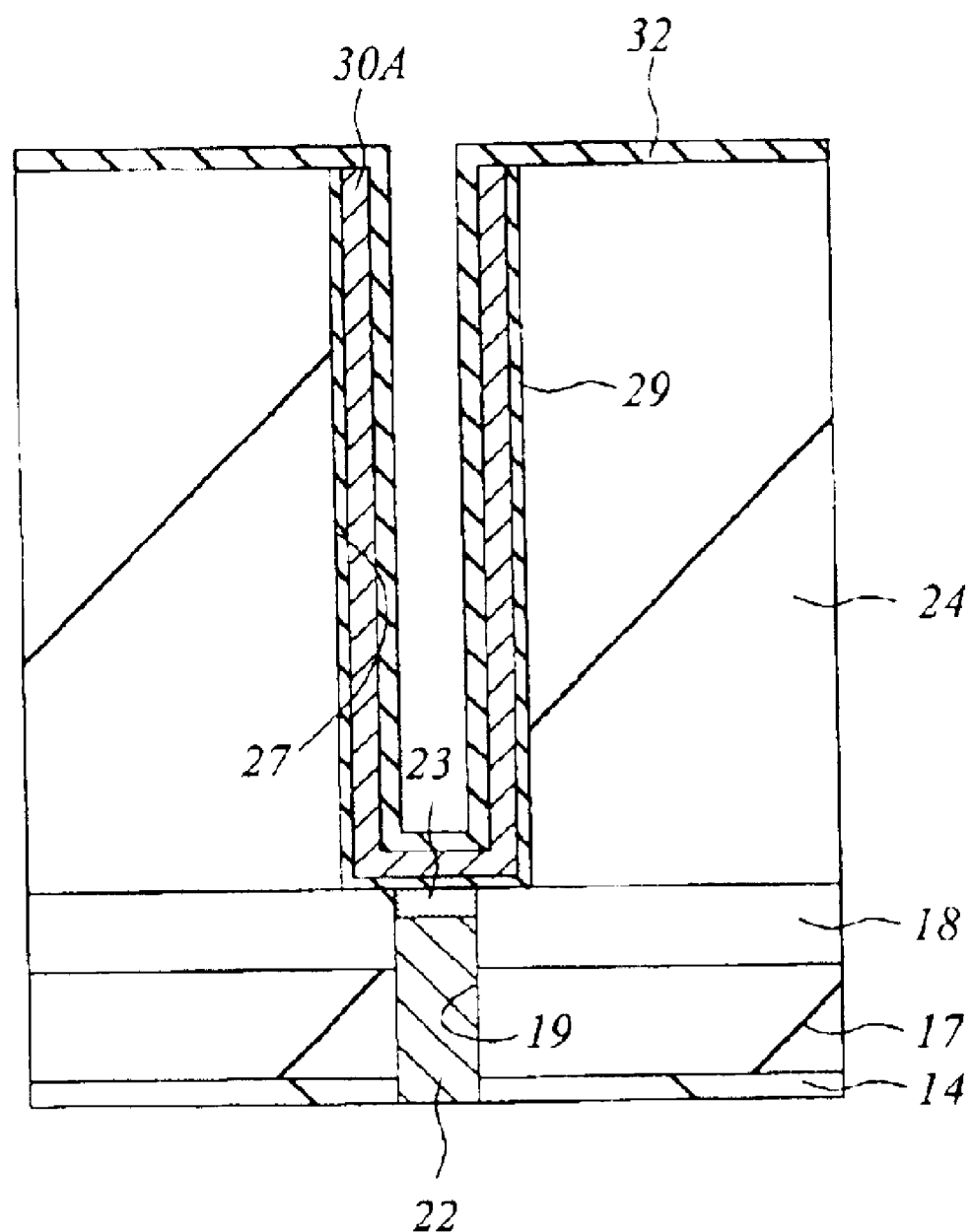
FIG. 14 is a cross-sectional view showing the principal part of a semiconductor substrate used in a method of manufacturing a semiconductor integrated circuit device according to a first embodiment of the present invention.

Next, as shown in FIG. 14, after a photoresist film (not shown) is coated on the Ru film 30 and the entire surface thereof is exposed, the photoresist film (not shown) is left in the hole 27 by development. This photoresist film is used as a protection film functioning to prevent the Ru film 30 inside (on a sidewall and bottom of) the hole 27 from being removed in the next step where the Ru film 30 unnecessary on the silicon oxide film 24 is removed by the dry etching Subsequently, the dry-etching is performed with using the photoresist film as a mask to remove the Ru film 30 located on the silicon oxide film 24, and thereby the lower electrode 30A is formed. Next, the photoresist film left in the hole 27 is removed.

Next, a tantalum oxide film 32 to be a capacitor dielectric film is deposited to about 10 nm inside the hole 27 in which the Ru film 30A is formed and on the silicon oxide film 24. The tantalum oxide film 32 is deposited by the CVD method using pentaethoxytantalum (Ta(OC$_2$H$_5$)$_5$) and oxygen as materials.

Figure 15:
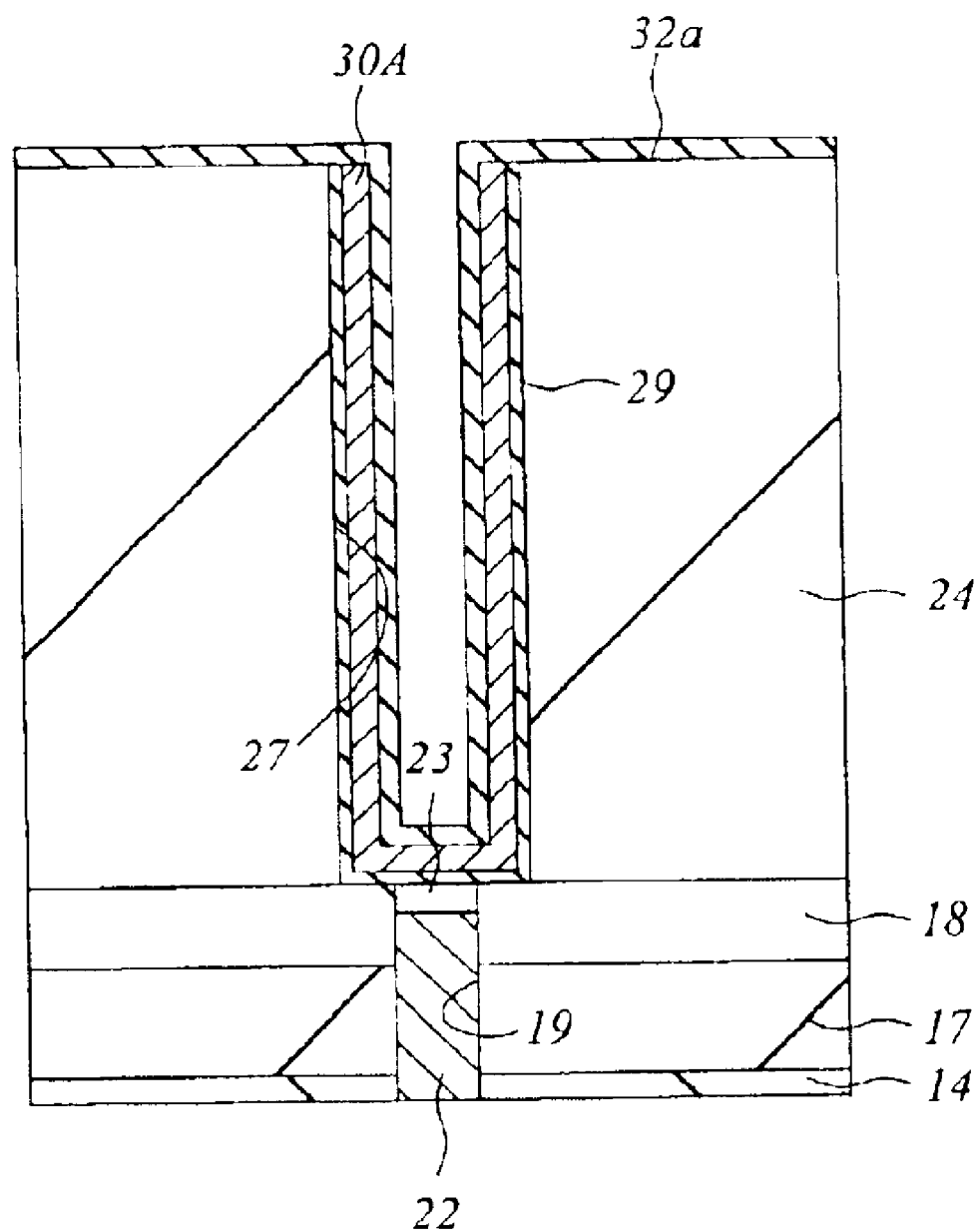
FIG. 15 is a cross-sectional view showing the principal part of a semiconductor substrate used in a method of manufacturing a semiconductor integrated circuit device according to a first embodiment of the present invention.

This tantalum oxide film 32 deposited by the CVD method is in an amorphous state, and so is made to crystallize by performing the heat treatment (annealing). The reference numeral 32a denotes the crystallized tantalum oxide film (FIG. 15). Also, by this heat treatment, defects in the tantalum oxide film can be repaired and thus the leak current can be reduced. Note that since the Ru film has a good crystalline property as described above, it is possible to reduce the film shrinkage of the Ru film at this heat treatment and thereby prevent the breakage of the tantalum oxide film 32.

Figure 16:
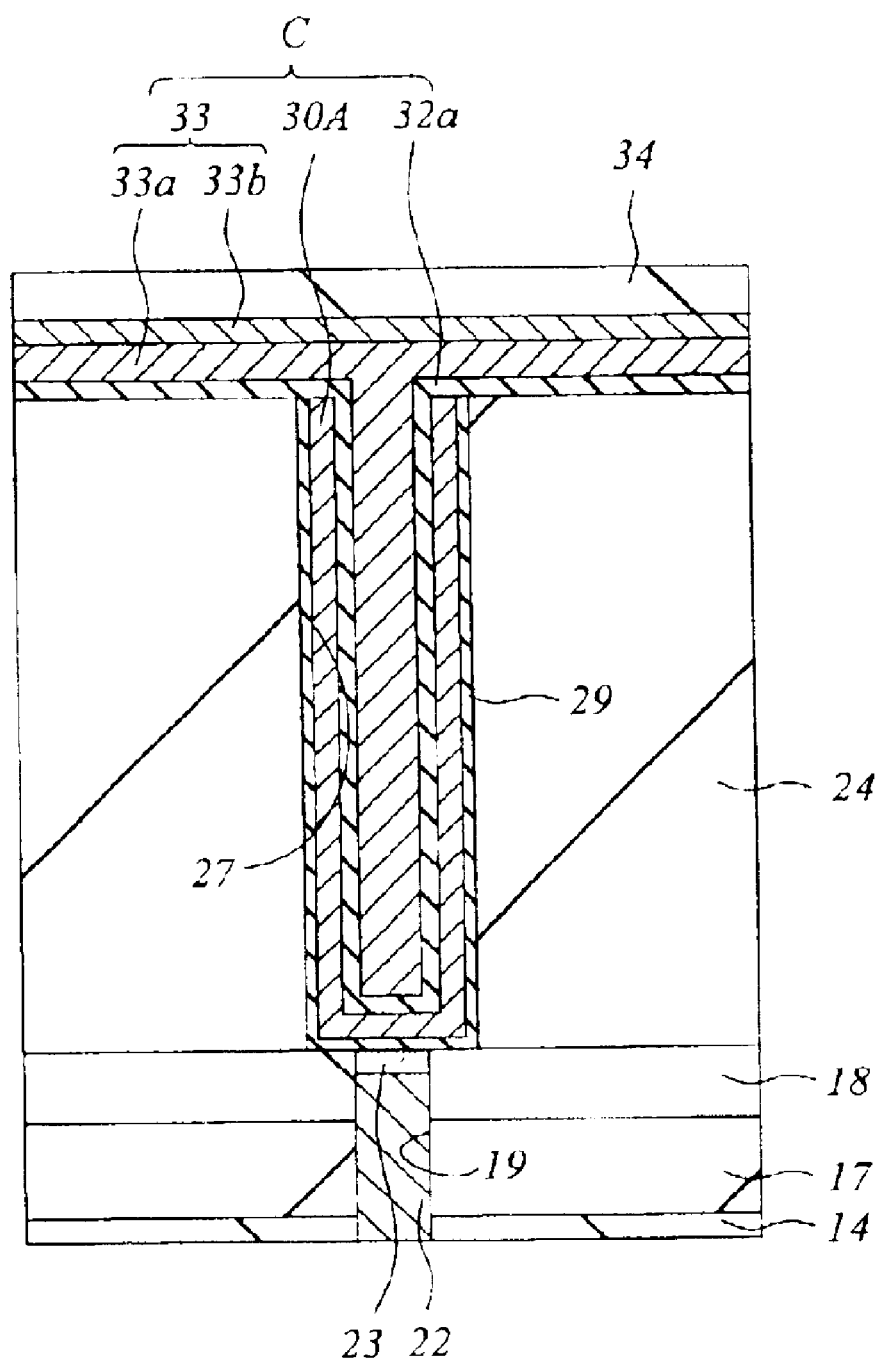
FIG. 16 is a cross-sectional view showing the principal part of a semiconductor substrate used in a method of manufacturing a semiconductor integrated circuit device according to a first embodiment of the present invention.

Next, an upper electrode 33 is formed on the tantalum oxide film 32a as shown in FIG. 16. The upper electrode 33 is formed, for example, by depositing an Ru film 33a (with a thickness of about 70 nm) and a W film 33b (with a thickness of about 100 nm) on the tantalum oxide film 32 by the CVD method. The Ru film 33a may be formed similarly to the Ru film 30. The W film 33b is used to reduce the contact resistance between the upper electrode 33 and an upper layer wiring.

Figure 17:
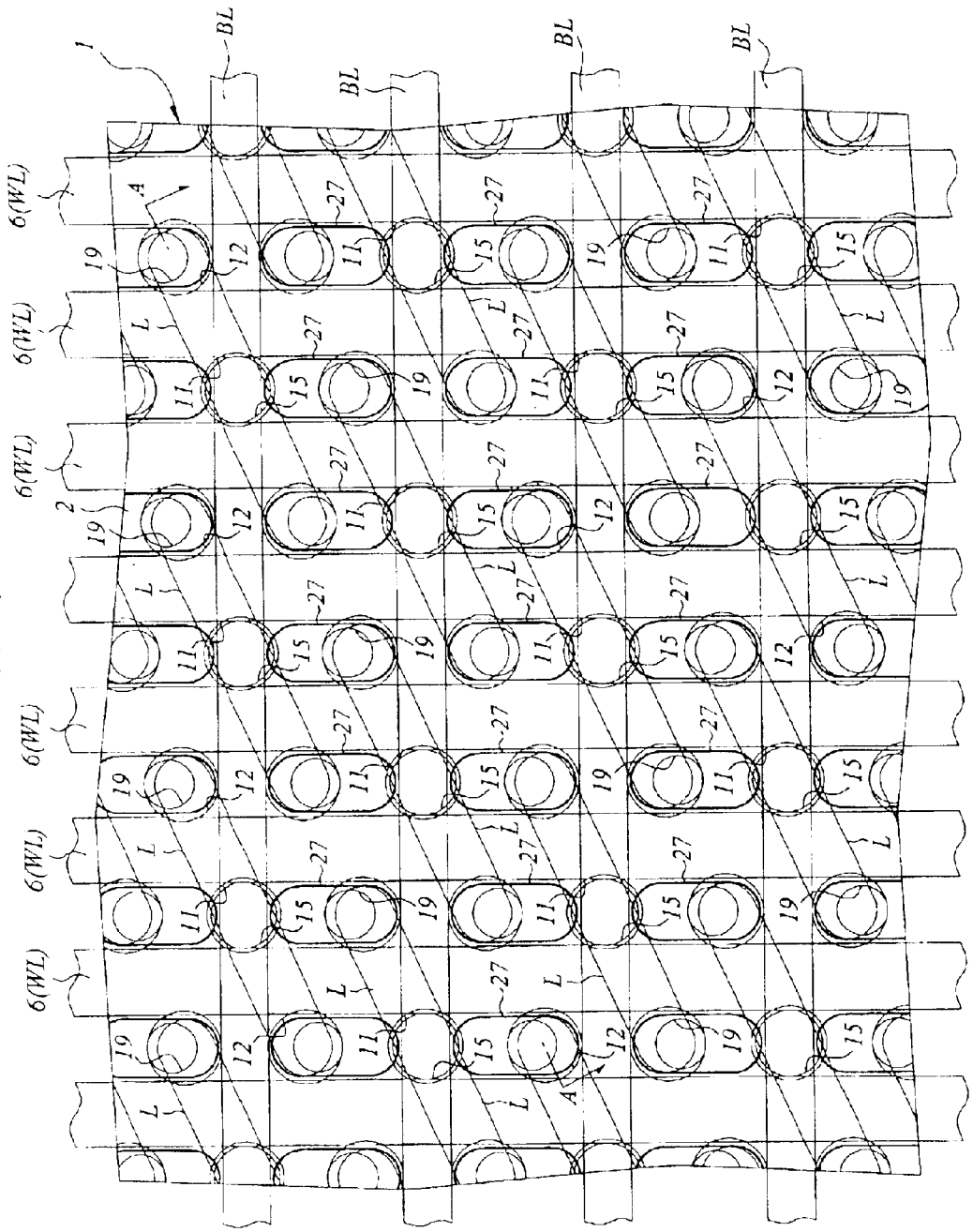
FIG. 17 is a plan view showing the principal part of a semiconductor substrate used in a method of manufacturing a semiconductor integrated circuit device according to a first embodiment of the present invention.

By the steps as mentioned above, the data storage capacitor C constituted by the lower electrode 30A made of the Ru film 30; a capacitor dielectric film made of the tantalum oxide film 32a; and the upper electrode 33 made of the W film 33b/Ru film 33a is completed, and the memory cell of the DRAM constituted by the memory cell selecting MISFET Qs and the data storage capacitor C connected thereto in series is almost completed. FIG. 17 is a plan view of the semiconductor integrated circuit device shown after the data storage capacitor C has been formed. FIG. 8 corresponds to, for example, the cross-sectional view taken along line A—A in FIG. 17.

Thereafter, an interlayer dielectric film 34 made of a silicon oxide film or the like is formed on the data storage capacitor C, and further an Al wiring composed of about two layers is formed on the interlayer dielectric film and a passivation film is formed on the uppermost layer of the Al wiring. However, illustrations of these are omitted.

According to this embodiment as described above, the disproportionate reaction using Ru(ACAC)(TMVS)$_2$ [Ru: one valence] as a material and H$_2$O as a catalyst is utilized to form the Ru film. Therefore, it is possible to reduce the byproducts to be taken in the Ru film and also to improve the film quality of the Ru film.

Consequently, it is possible to improve characteristics of the data storage capacitor C and characteristics of the memory cell. In addition, it is possible to ensure a desired amount of capacitance even in the fine memory cell structure.

In this embodiment, the lower electrode has been formed by the Ru film formed with using the one-valence Ru compound, but may be formed by the Ru film formed with using the two-valence Ru compound. As the two-valence Ru compound, Ru (ACAC)$_2$(TMVS) or the like is exemplified. As the main reaction caused at this time, for example, the reaction as shown in FIG. 18 is thought.

The Ru compounds (RuA$_x$B$_y$) to be used in the disproportionate reaction are summarized in FIG. 28. As shown in FIG. 28, "A" of this Ru compound (RuA$_x$B$_y$) corresponds to a radical having electron localized between carbons consisting of ketone such as a acetylacetone derivative, and "B" thereof corresponds to a molecule coordinated by double bond such as TMVS described above, TEVS (triethylvinylsilane), or COD. Each Value of "x" and "y" thereof changes depending on the oxidation number to be taken by the Ru.

(Second Embodiment)

In the first embodiment, the lower electrode has been formed with using Ru. However, the lower electrode may be formed with using Ir (iridium).

Hereinafter, a method of manufacturing a DRAM according to this embodiment will be described. Note that a step of forming the barrier layer 23 in a second embodiment will be omitted because being similar to that in the first embodiment described with reference to FIGS. 1 to 8.

Subsequently, a data storage capacitor C constituted by a lower electrode 30A made of an Ir film 230; the capacitor dielectric film made of the tantalum oxide film 32; and an upper electrode 33 made of a W film/Ir film is formed over the barrier layer 23.

The forming process of the data storage capacitor C will be described in detail with reference to FIGS. 19 to 26. These figures schematically show a predetermined region for forming the data storage capacitor C over the plug 22.

Figure 19:
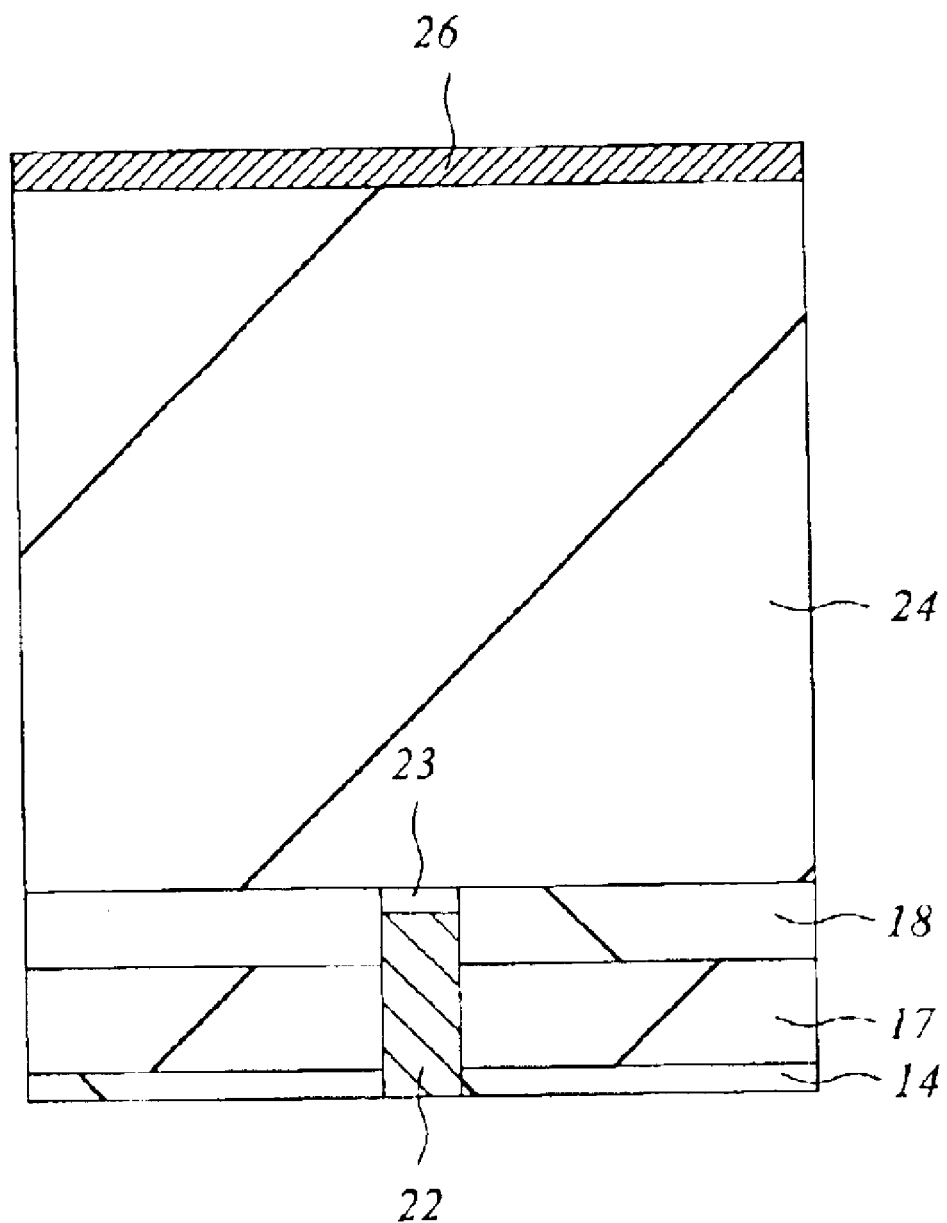
FIG. 19 is a cross-sectional view showing the principal part of a semiconductor substrate used in a method of manufacturing a semiconductor integrated circuit device according to a second embodiment of the present invention.
Figure 20:
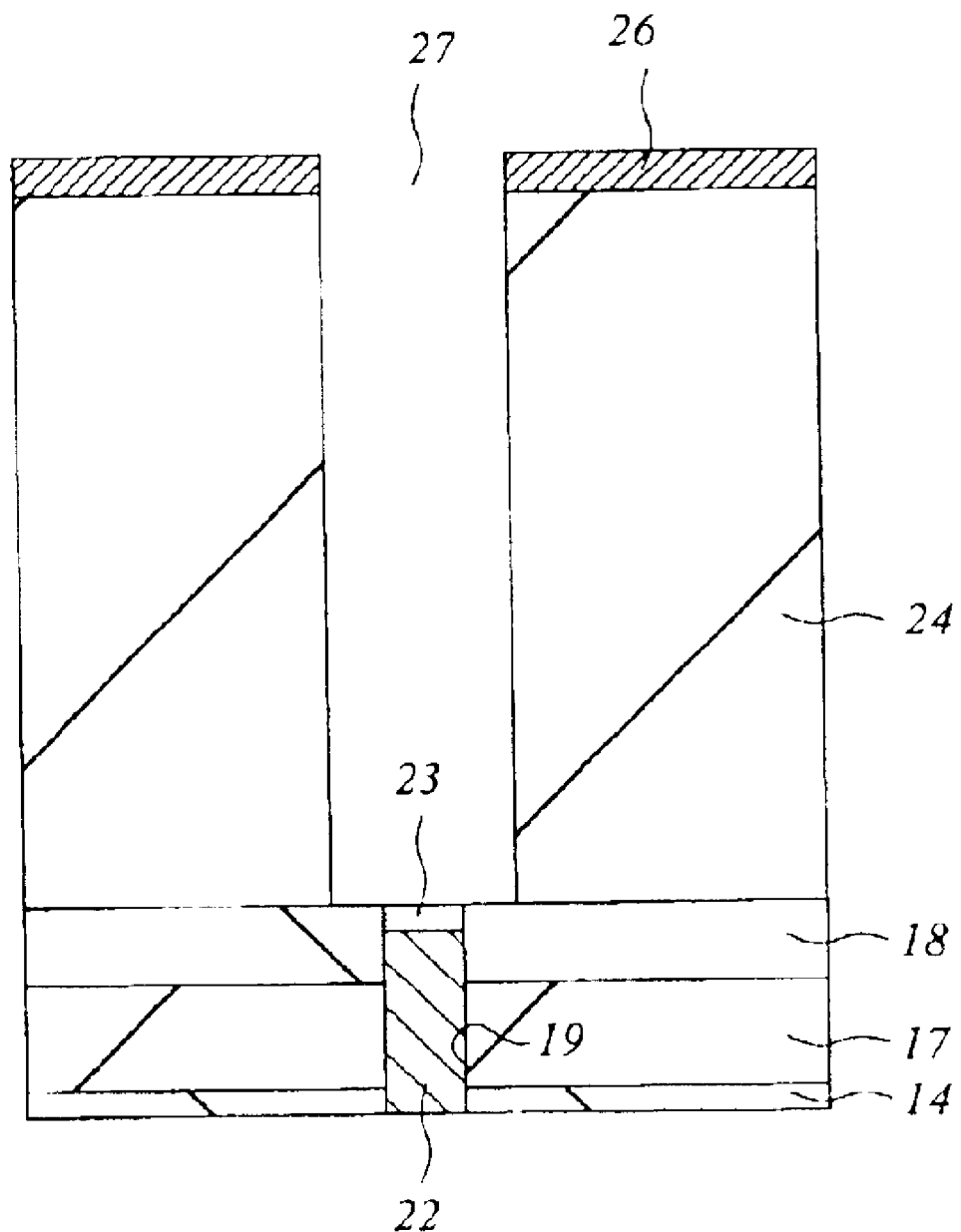
FIG. 20 is a cross-sectional view showing the principal part of a semiconductor substrate used in a method of manufacturing a semiconductor integrated circuit device according to a second embodiment of the present invention.

Similarly to the first embodiment, the silicon oxide film 24 is formed on the barrier layer 23 and the silicon nitride film 18 as shown in FIG. 19. Next, the hard mask 26 is formed on the silicon oxide film 24. Then, the silicon oxide film 24 is dry-etched with using the hard mask 26 as a mask, and thereby a deep hole (concave portion) 27 is formed as shown in FIG. 20. The surface of the barrier layer 23 embedded in the through hole 19 is exposed to the bottom surface of the deep hole (concave portion) 27.

Figure 21:
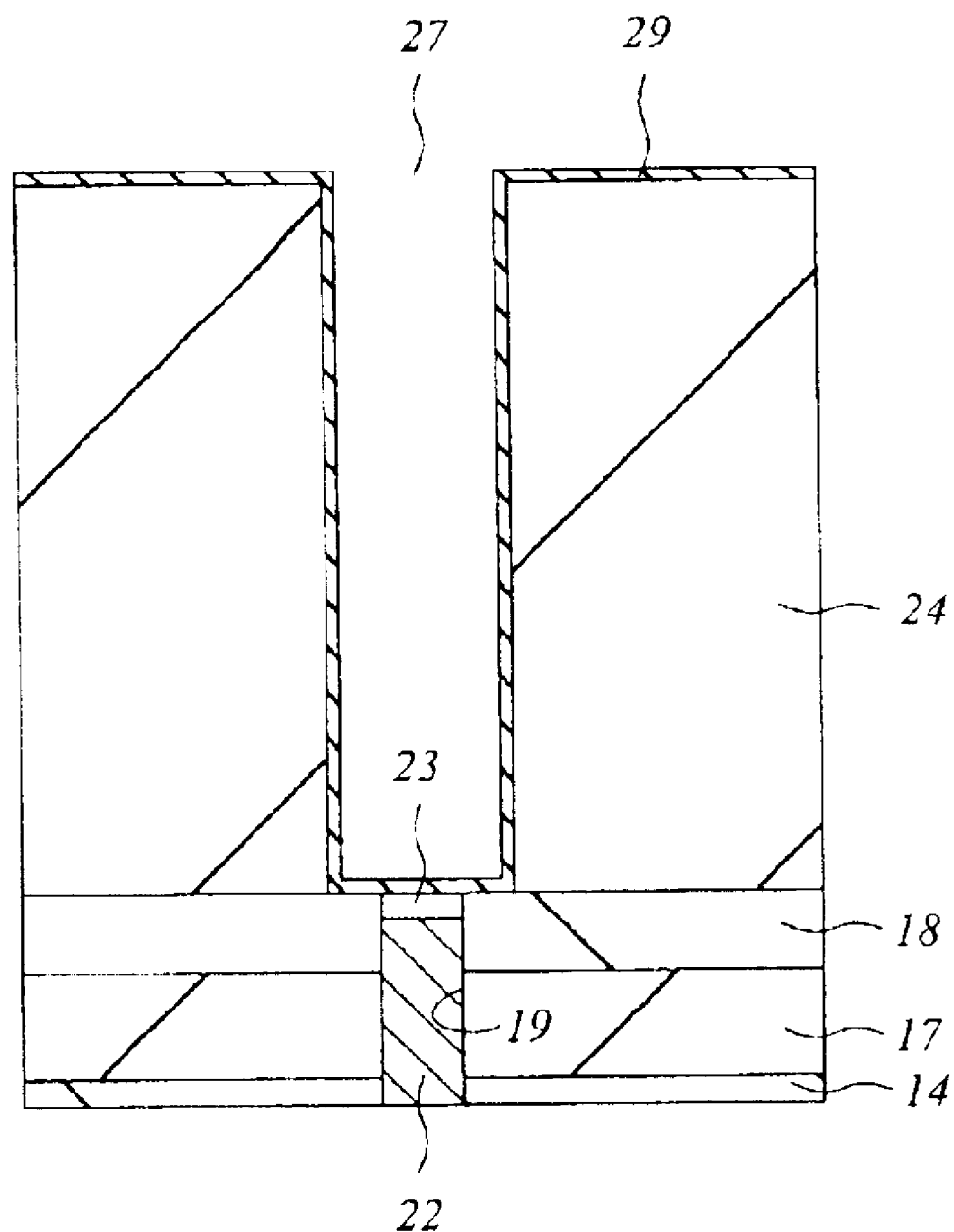
FIG. 21 is a cross-sectional view showing the principal part of a semiconductor substrate used in a method of manufacturing a semiconductor integrated circuit device according to a second embodiment of the present invention.

Next, the hard mask 26 remaining on the silicon oxide film 24 is removed by the use of a solution containing hydrogen peroxide water. Thereafter, as shown in FIG. 21, similarly to the first embodiment, the WN film 29 (with a thickness of about 15 nm) is deposited on the silicon oxide film 24 and inside the hole 27 by the sputtering method. This WN film 29 is used as an adhesion layer because having an excellent adhesiveness to the silicon oxide film 24 to be ground and the Ir film 230 described later.

Figure 22:
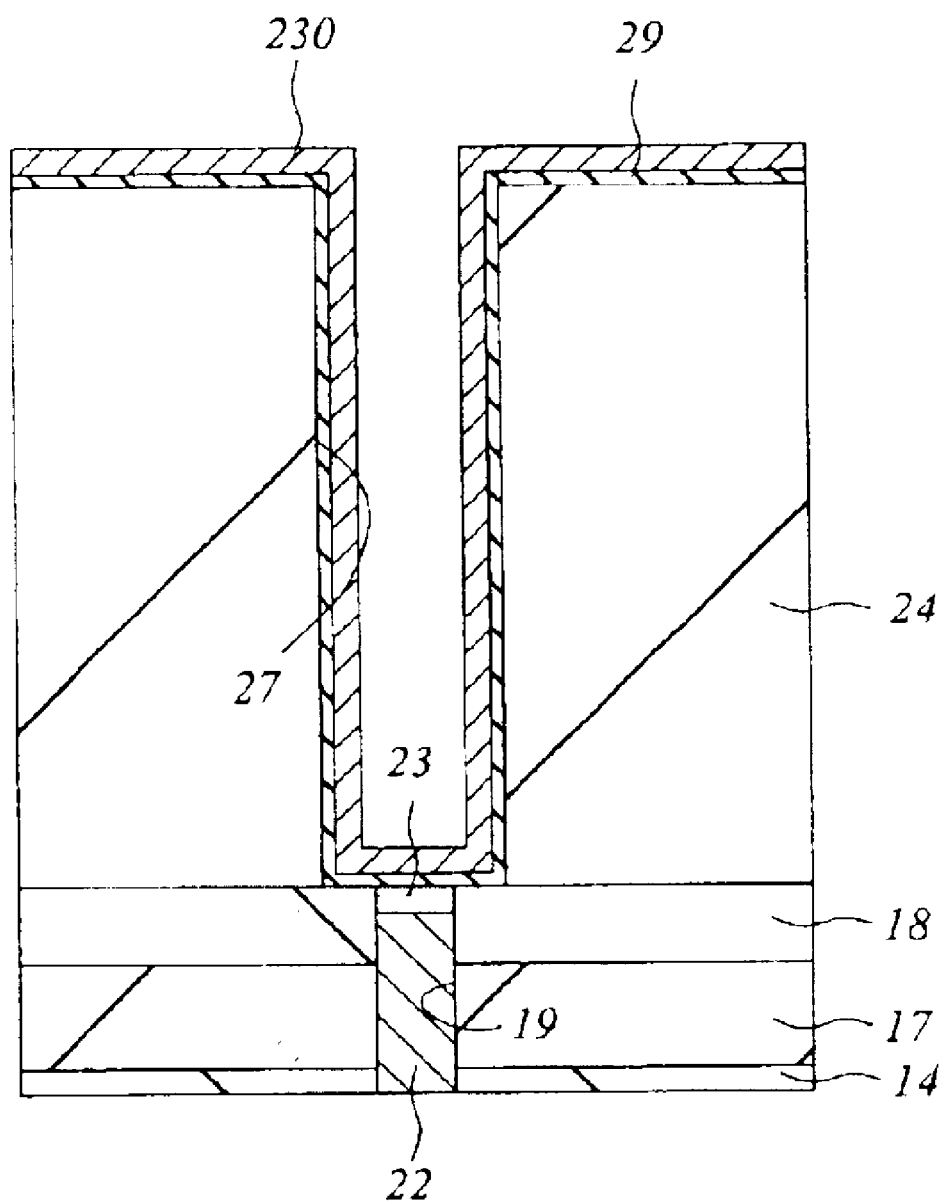
FIG. 22 is a cross-sectional view showing the principal part of a semiconductor substrate that illustrates the method of manufacturing a semiconductor integrated circuit device according to the second embodiment of the present invention.

Next, as shown in FIG. 22, the Ir film 230 (with a thickness of about 30 nm) is deposited on the WN film 29 by the CVD method. However, before the Ir film is deposited by this CVD method, an Ir film (not shown) having a thickness of about 15 nm is formed by the sputtering method. This is because the film formed by the sputtering method becomes a seed and thereby the Ir film 230 formed by the sputtering method is made to grow effectively.

This Ir film 230 can be formed by, for example, the CVD method using Ir(THD) (COD), which is an Ir organic compound, as a material and $H_2O$ as a catalyst. In this case, THD means 2,2,6,6-tetra-methyl-3,5-heptadionate $((CH_3)_3CCOCHCOC(CH_3)_3)^-$ and COD means 1,5-cycrooctadiene $(C_8H_{12})$. Note that each structural formula of THD and COD is shown in FIG. 27.

This Ir compound is vaporized and is disproportionated, and thereby the Ir film is formed. The main reaction caused in forming the Ir film is thought, for example, to be such a reaction that Ir(THD)(COD) becomes Ir, Ir(THD)$_3$ and COD. In this case, Ir of Ir(THD) (COD) has a valence of one, Ir to be generated has a valence of zero, and Ir of Ir(THD)$_3$ has a valence of three. More specifically, the disproportionate reaction occurs in which zero-valence Ir and the Ir compound containing three-valence Ir are generated from the Ir compound containing one-valence Ir.

Also, $H_2O$ is not consumed in this reaction and functions as a kind of catalyst, and the reaction rate thereof is increased by adding $H_2O$ to the reaction system. This $H_2O$ is thought to be adsorbed onto the material and so promote the reaction. Note that since the reaction chamber in which such reaction is performed is exhausted, it is necessary to appropriately supply $H_2O$ similarly to Ir(THD) (COD) that is an essential material. In addition, once the reaction has begun, Ir (solid state) is exhausted from the reaction system. Therefore, the reaction proceeds to right in terms of the reaction formula shown in FIG. 23.

According to this embodiment as described above, since the disproportionate reaction using Ir(THD)(COD) [Ir: one valence] as a material and $H_2O$ as a catalyst is utilized to form the ITr film, the Ir film having a good film quality can be formed similarly to the Ru film described in the first embodiment.

More specifically, it possible to reduce the by-products to be taken in the Ir film, such as carbon, hydrogen and a compound(s) thereof, and to form the Ir film having a good crystalline property. Consequently, even if carbon, hydrogen and an oxygen compound(s) thereof taken in the Ir film are vaporized by the heat treatment thereafter performed, for example, the heat treatment for densifying the Ir film, or the like, then the film quality of the Ir film can be kept with the vaporized amount thereof small. Also, even at the time of the heat treatment of the capacitor dielectric film formed on the lower electrode (Ir film 230) described later, it is possible to reduce the film shrinkage caused by the vaporization of carbon or the like included in the Ir film, and thereby prevent the breakage of the capacitor dielectric film. As a result, the characteristics of the data storage capacitor C can be improved. In addition, the amounts of oxygen and oxygen compound(s) included in the Ir film can be reduced and the conduction failure between the plug 22 and the lower electrode (Ir film 230) can be prevented.

Further, for example, since the sublimation temperature of Ir(THD) (COD) is within a range of 115° C. to 140° C. and this disproportionate reaction proceeds even at a temperature equal to or lower than 250° C., the oxidation of the metal films located below said Ir film (e.g., WN film (adhesion layer), barrier layer (WN film), and plug (silicon film)) can be prevented.

Next, the heat treatment at 700° C. for one minute is performed in a nitride atmosphere to densify the Ir film 230.

Figure 24:
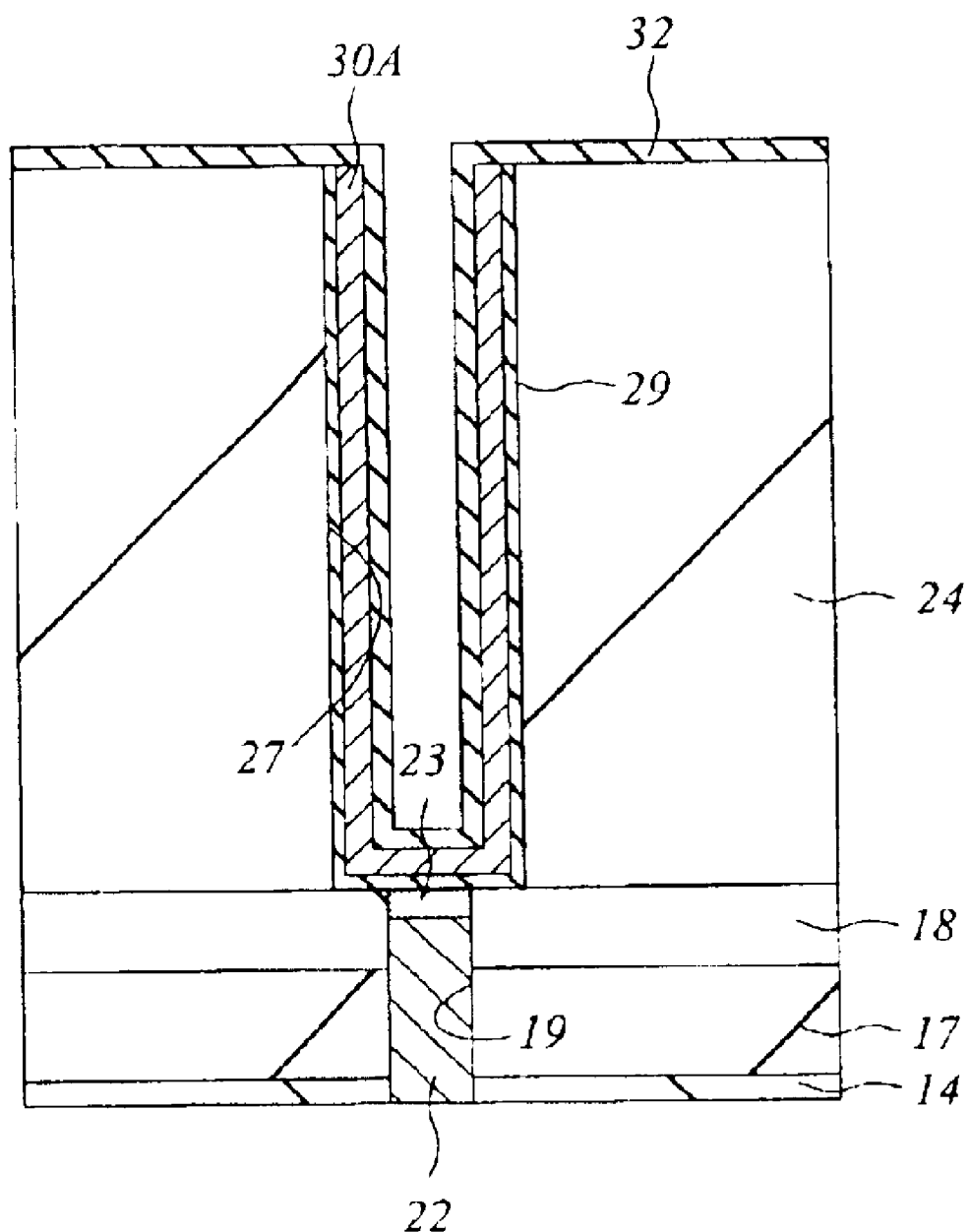
FIG. 24 is a cross-sectional view showing the principal part of a semiconductor substrate used in a method of manufacturing a semiconductor integrated circuit device according to a second embodiment of the present invention.

Then, as shown in FIG. 24, after a photoresist film (not shown) is coated on the Ir film 230 and the entire surface thereof is exposed, the photoresist film (not shown) is left in the hole 27 by development. This photoresist film is used as a protection film functioning to prevent the Ir film 230 inside (on the sidewall and bottom of) the hole 27 from being removed in the next step where the Ir film 230 unnecessary on the silicon oxide film 24 is removed by the dry etching. Subsequently, the dry-etching is performed with using the photoresist film as a mask, thereby removing the Ir film 230 on the silicon oxide film 24, and thus the lower electrode 30A is formed. Then, the photoresist film in the hole 27 is removed.

Next, a tantalum oxide film 32 to be a capacitor dielectric film is deposited to about 10 nm inside the hole 27 in which the lower electrode 30A is formed and on the silicon oxide film 24. The tantalum oxide film 32 is deposited by the CVD method using pentaethoxytantalum $(Ta(OC_2H_5)_5)$ and oxygen as materials.

Figure 25:
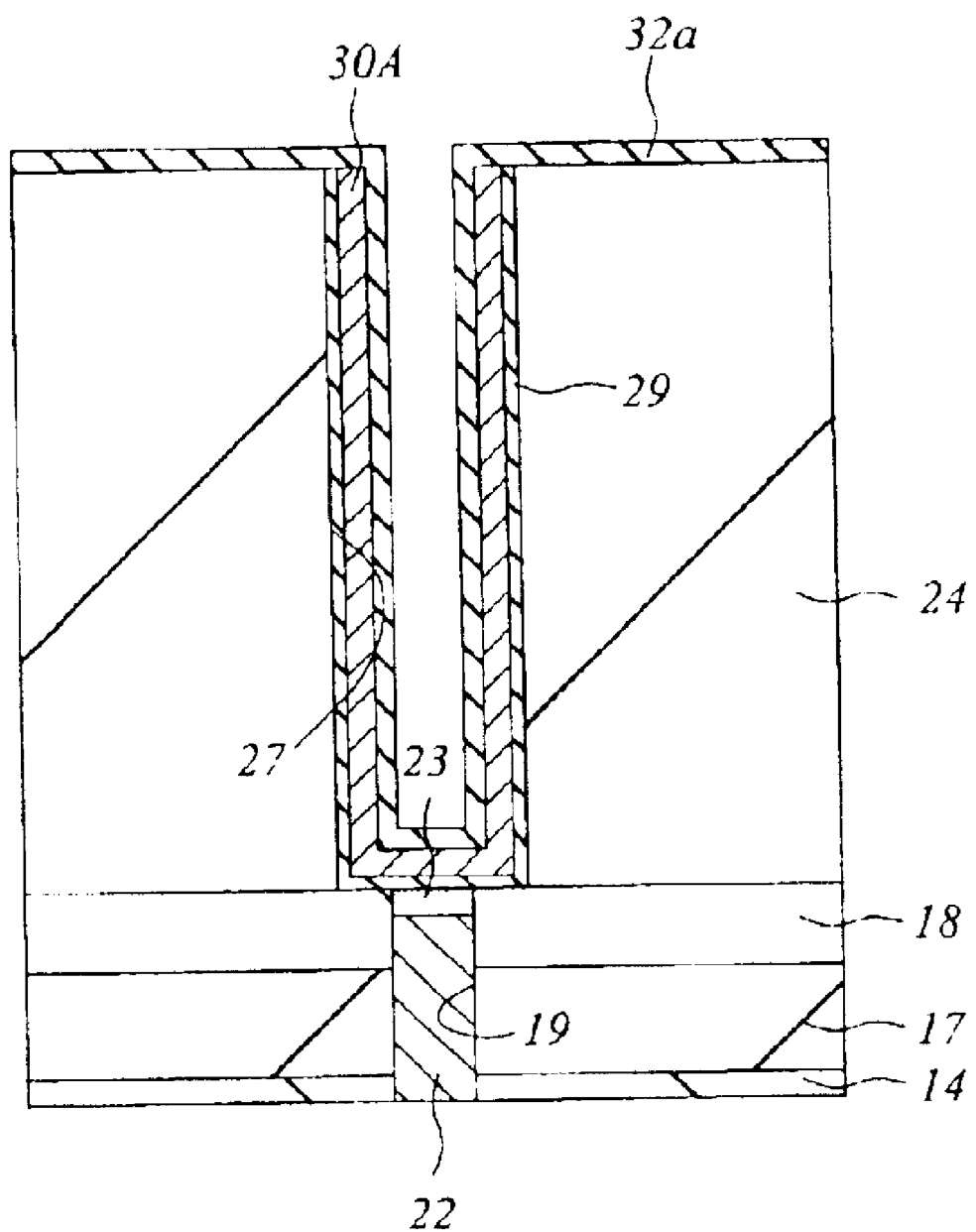
FIG. 25 is a cross-sectional view showing the principal part of a semiconductor substrate used in a method of manufacturing a semiconductor integrated circuit device according to a second embodiment of the present invention.

This tantalum oxide film 32 deposited by the CVD method is in an amorphous state and so is made to crystallize by performing the heat treatment (annealing). The reference numeral 32a denotes the crystallized tantalum oxide film (FIG. 25). Also, by this heat treatment, it is possible to repair defects caused in the tantalum oxide film and reduce the leak current. Note that since the Ir film has a good crystalline property as described above, it is possible to reduce the film shrinkage of the Ir film at the time of the heat treatment and prevent the breakage of the tantalum oxide film 32.

Figure 26:
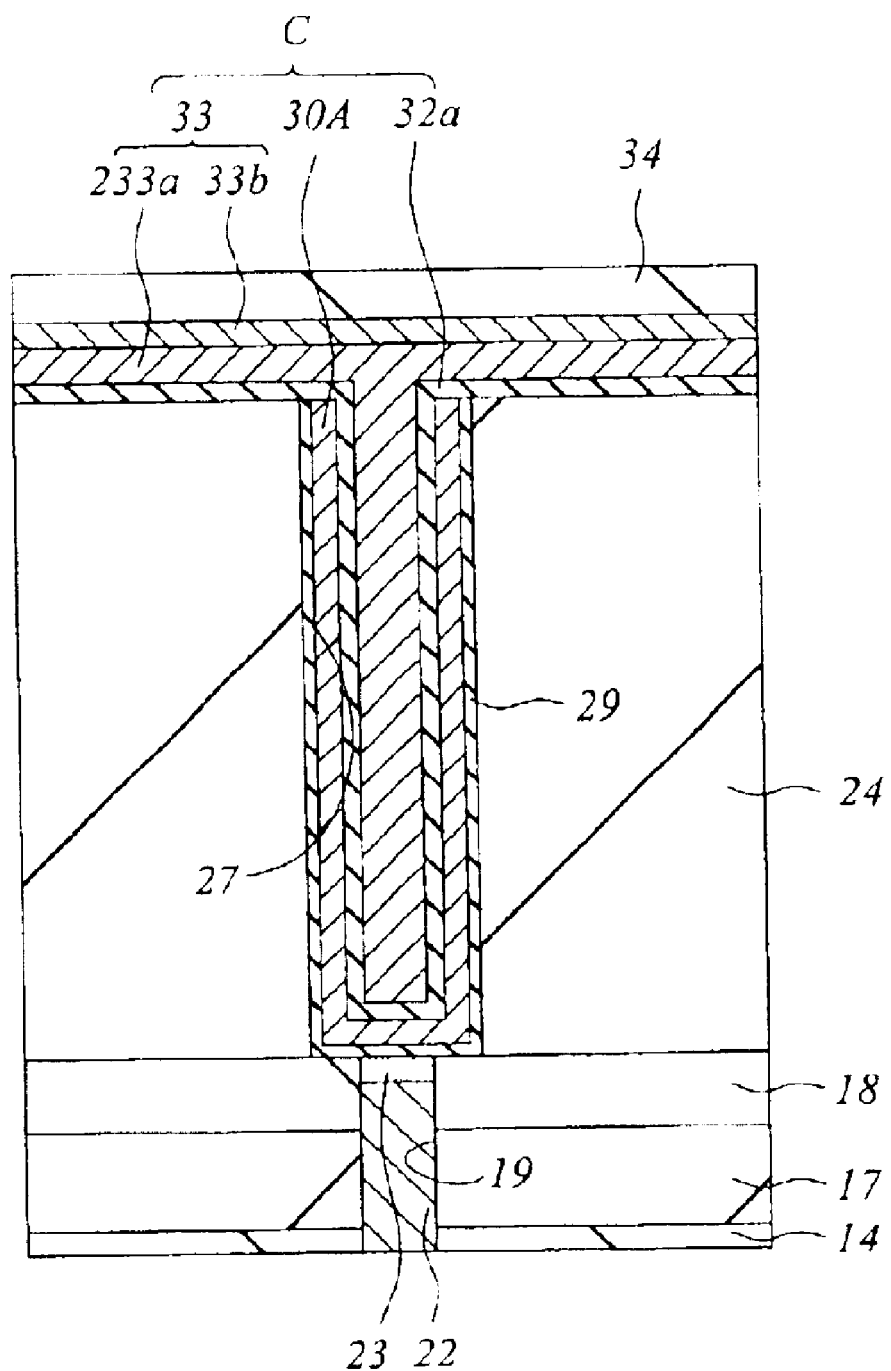
FIG. 26 is a cross-sectional view showing the principal part of a semiconductor substrate used in a method of manufacturing a semiconductor integrated circuit device according to a second embodiment of the present invention.

Next, as shown in FIG. 26, an upper electrode 33 is formed on the tantalum oxide film 32. The upper electrode 33 is formed by, for example, depositing an Ir film 233a (with a thickness of about 70 nm) and a W film 33b (with a thickness of about 100 nm) on the tantalum oxide film 32 by the CVD method. The Ir film 233a may be formed similarly to the Ir film 230. The W film 33b is used to reduce the contact resistance between the upper electrode 33 and the upper layer wiring.

By the steps as mentioned above, the data storage capacitor C, constituted by the lower electrode 30A made of the Ir film 230, the capacitor dielectric film made of the tantalum oxide film 32, and the upper electrode 33 made of the W film 33b/Ir film 233a, is completed, and the memory cell of the DRAM constituted by the memory cell selecting MISFET Qs and the data storage capacitor C connected thereto in series is almost completed (see FIG. 17).

Thereafter, an interlayer dielectric film 34 made of a silicon oxide film or the like is formed on the data storage capacitor C, and further an Al wiring composed of about two layers is formed on this interlayer dielectric film and a passivation film is formed on the uppermost layer of the Al wiring. However, illustrations of these are omitted.

According to this embodiment as described above, the disproportionate reaction using Ir(THD) (COD) [Ir: one valence] as a material and $H_2O$ as a catalyst is utilized to form the Ir film. Therefore, it is possible to reduce the by-products to be taken in the Ir film and improve the film quality of the Ir film.

As a result, it is possible to improve respective characteristics of the data storage capacitor C and the memory cell. Also, a desired amount of capacitance can be ensured even in the fine memory cell structure.

In this embodiment, the Ir film is formed with using Ir(THD)(COD) [Ir: one valence] as a material. However, Ir(ACAC) (COD) or the like is exemplified as a one-valence Ir compound. Also, the lower electrode may be formed by the Ir film formed with using the two-valence Ir compound as well as the one-valence Ir compound. For example, the Ir film can be formed with utilizing the disproportionate reaction generating zero-valence Ir and the three-valence Ir compound by using the two-valence Ir compound.

In this case, the Ir compound ($IrA_xB_y$) used in the disproportionate reaction is summarized in FIG. 28. As shown in FIG. 28, "A" of the Ir compound ($IrA_xB_y$) corresponds to a radical having electron localized between carbons consisting of ketone such as an acetylacetone derivative, and "B" thereof corresponds to a molecule coordinated by double bond such as TMVS described above or COD. Each value of "x" and "y" thereof changes depending on the oxidation number to be taken by Ir.

In the first and second embodiments, the Ru film and the Ir film have been formed with using the Ru compound and the Ir compound, respectively. However, the present invention is widely applicable to the formation of a metal film made of a so-called platinum group metal (platinum (Pt), palladium (Pd), ruthenium (Ru), iridium (Ir), rhodium (Rh) and osmium (Os)). Also, in the first and second embodiments, the metal film has been formed by using the compound whose the oxidation number has a valence of one or two. However, the oxidation number used in the present invention is not limited to this. More specifically, since a platinum group organic compound having the oxidation number A is made to react by using $H_2O$ as a catalyst, it becomes a platinum group metal (oxidation number=0) and a platinum group compound having the oxidation number B (B>A) and so a platinum group metal film having a good film quality can be formed.

In the foregoing, the inventions made by the inventors have been described based on the embodiments in detail. However, the present invention is not limited to the abovementioned embodiments and, needless to say, can variously be changed and modified without departing from the scope of the present invention.

The advantages achieved by the typical ones of the inventions disclosed in this application will be briefly described as follows.

1. A platinum group metal is formed on a semiconductor substrate by the reaction using a one-valence or two-valence platinum group compound(s) as a material and $H_2O$ as a catalyst. Therefore, a platinum group compound film having a good film quality can be formed. Also, since $H_2O$ is added as a catalyst, it is possible to increase the reaction rate thereof.

2. In the steps of forming a first conductor, forming a second conductor on said first conductor, and thereafter forming a three conductor on said second conductor, the third conductor made of a platinum group metal is formed on a second conductor by using a one-valence or two-valence platinum group metal as a material and $H_2O$ as a catalyst. Therefore, a platinum group compound film having a good film quality can be formed. Further, the characteristics of the platinum group metal film are improved, and so each oxidation of the first conductor and the second conductor can be prevented.

As a result, it is possible to improve respective characteristics of the data storage capacitor and the memory cell. Further, it is possible to ensure a desired amount of capacitance even in the fine memory cell structure.

What is claimed is:

1. A method of manufacturing a semiconductor device, comprising the step of:

forming a platinum group metal over a semiconductor substrate, wherein the platinum group metal is formed by a reaction using a one-valence or two-valence platinum group compound as a material and $H_2O$ as a catalyst.

2. The method according to claim 1, wherein said platinum group material is one of ruthenium (Ru) and Iridium (Ir).

3. The method according to claim 1, wherein said platinum group compound is an acetylacetone derivative of Ru.

4. The method according to claim 1, wherein said platinum group compound is an acetylacetone derivative of Ir.

5. The method according to claim 1, wherein said step of forming the platinum group metal is performed at a temperature of 250° C. or less.

6. The method according to claim 1, wherein said platinum group metal is used as an electrode constituting a capacitor.

7. A method of manufacturing a semiconductor device, comprising the steps of:

(a) forming a first conductor over a semiconductor substrate;

(b) forming a second conductor over said first conductor; and (c) forming a third conductor over said second conductor, wherein the third conductor made of a platinum group metal is formed by a reaction using a one-valence or two-valence platinum group compound as a material and $H_2O$ as a catalyst.

8. The method according to claim 7, wherein said first conductor is made of one of polysilicon and tungsten.

9. The method according to claim 7, wherein said second conductor is made of one of tungsten, tungsten nitride, tantalum, tantalum nitride, and titanium nitride.

10. The method according to claim 7, wherein said step of forming the third conductor made of the platinum group metal is performed at a temperature of 250° C. or less.

11. The method according to claim 7, wherein said third conductor is used as an electrode constituting a capacitor.

12. A method of manufacturing a semiconductor device, comprising the steps of:

forming a platinum group metal over a substrate, wherein said platinum group metal is formed by a disproportionation reaction using a platinum group compound as a material and $H_2O$ as a catalyst.

13. The method according to claim 12,
wherein said platinum group metal is one of ruthenium (Ru) and iridium (Ir).

14. The method according to claim 13,
wherein said platinum group metal is used as an electrode constituting a capacitor.

* * * * *